United States Patent
Iwamoto et al.

(10) Patent No.: US 9,894,744 B2
(45) Date of Patent: Feb. 13, 2018

(54) EXTREME ULTRAVIOLET LIGHT GENERATION APPARATUS

(71) Applicant: Gigaphoton Inc., Tochigi-ken (JP)

(72) Inventors: Fumio Iwamoto, Oyama (JP); Yutaka Shiraishi, Oyama (JP); Tsukasa Hori, Oyama (JP); Takuya Ishii, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/062,896

(22) Filed: Mar. 7, 2016

(65) Prior Publication Data
US 2016/0192470 A1 Jun. 30, 2016

Related U.S. Application Data

(63) Continuation of application No. PCT/JP2013/079092, filed on Oct. 28, 2013.

(51) Int. Cl.
H05G 2/00 (2006.01)
G03F 7/20 (2006.01)

(52) U.S. Cl.
CPC ......... *H05G 2/008* (2013.01); *G03F 7/70908* (2013.01); *H05G 2/005* (2013.01)

(58) Field of Classification Search
CPC ........ H05G 5/003; H05G 5/005; H05G 5/008; G03F 7/70908
See application file for complete search history.

(56) References Cited

U.S. PATENT DOCUMENTS

| 7,872,245 B2 | 1/2011 | Vaschenko et al. |
| 8,138,487 B2 | 3/2012 | Vaschenko et al. |
| 2009/0224181 A1 | 9/2009 | Abe et al. |
| 2009/0230326 A1 | 9/2009 | Vaschenko et al. |
| 2010/0097593 A1* | 4/2010 | Murakami .......... G03F 7/70033 355/67 |
| 2010/0213395 A1 | 8/2010 | Ueno et al. |
| 2010/0231130 A1 | 9/2010 | Labetski et al. |
| 2010/0258748 A1* | 10/2010 | Vaschenko .......... H05G 2/003 250/504 R |

(Continued)

FOREIGN PATENT DOCUMENTS

| JP | 2008-078031 A | 4/2008 |
| JP | 2009-218323 A | 9/2009 |

(Continued)

OTHER PUBLICATIONS

International Search Report issued in PCT/JP2013/079092; dated Jan. 28, 2014.

(Continued)

*Primary Examiner* — Wyatt Stoffa
*Assistant Examiner* — Eliza Osenbaugh-Stewart
(74) *Attorney, Agent, or Firm* — Studebaker & Brackett PC

(57) ABSTRACT

An extreme ultraviolet light generation apparatus may include: a chamber in which extreme ultraviolet light is generated when a target is irradiated with a laser beam inside the chamber; a target supply part configured to supply the target into the chamber; and a target collector configured to collect the target which is supplied by the target supply part but is not irradiated with the laser beam in a collection container, by receiving the target on a receiving surface having a contact angle of greater than 90 degrees with the target.

18 Claims, 15 Drawing Sheets

(56) References Cited

U.S. PATENT DOCUMENTS

| | | |
|---|---|---|
| 2010/0258749 A1 | 10/2010 | Partlo et al. |
| 2010/0258750 A1 | 10/2010 | Partlo et al. |
| 2012/0057680 A1* | 3/2012 | Hemberg ............ G03F 7/70033 378/125 |
| 2012/0119116 A1 | 5/2012 | Kakizaki et al. |
| 2012/0205559 A1 | 8/2012 | Yabu et al. |
| 2012/0217422 A1 | 8/2012 | Yabu et al. |
| 2012/0248343 A1* | 10/2012 | Nagai ................... H05G 2/003 250/504 R |
| 2013/0134326 A1* | 5/2013 | Yabu ..................... H05G 2/003 250/455.11 |
| 2016/0192470 A1 | 6/2016 | Iwamoto |

FOREIGN PATENT DOCUMENTS

| | | |
|---|---|---|
| JP | 2010-171405 A | 8/2010 |
| JP | 2010-212685 A | 9/2010 |
| JP | 2011-023712 A | 2/2011 |
| JP | 2011-514648 A | 5/2011 |
| JP | 2012-523666 A | 10/2012 |
| JP | 2012-212654 A | 11/2012 |
| JP | 2013-084892 A | 5/2013 |
| JP | 2013-131483 A | 7/2013 |
| WO | 2010/112048 A1 | 10/2010 |

OTHER PUBLICATIONS

Written Opinion issued in PCT/JP2013/079092; dated Jan. 28, 2014.

International Search Report (PCT/ISA/210) dated Apr. 28, 2014 from co-related U.S. Appl. No. 15/152,124 which corresponds to PCT/JP2013/085184, 5 pp.

Written Opinion (PCT/ISA/237) dated Apr. 28, 2014 from co-related U.S. Appl. No. 15/152,124 which corresponds to PCT/JP2013/085184, 3 pp.

An Office Action; "Notification of Reasons for Refusal," mailed by the Japanese Patent Office dated Sep. 19, 2017, which corresponds to Japanese Patent Application No. 2015-544628 and is related to U.S. Appl. No. 15/062,896; with English Translation.

An Office Action; "Notification of Reasons for Refusal," mailed by the Japanese Patent Office dated Nov. 21, 2017, which corresponds to Japanese Patent Application No. 2015-554466 and is related to the co-pending U.S. Appl. No. 15/152,124; with English Translation.

* cited by examiner

| MATERIAL | CONTACT ANGLE (°) |
|---|---|
| ALUMINIUM | 43 |
| COPPER | 64 |
| SILICON | 79 |
| NICKEL | 80 |
| TITANIUM | 89 |
| MOLYBDENUM (WITH VACUUM HEAT TREATMENT) | 30~70 |
| SILICON CARBIDE | 123~150 |
| SILICON NITRIDE | 140~168 |
| ALUMINIUM OXIDE | 163 |
| ZIRCONIUM OXIDE | 140~153 |
| GRAPHITE | 149 |
| DIAMOND | 125~135 |
| SILICON OXIDE | 120~150 |
| MOLYBDENUM OXIDE (WITHOUT VACUUM HEAT TREATMENT) | 120~130 |

*FIG.7*

EXTREME ULTRAVIOLET LIGHT GENERATION APPARATUS

CROSS-REFERENCES TO RELATED APPLICATIONS

This application claims the benefit of International Patent Application No. PCT/JP2013/079092 filed Oct. 28, 2013, which is incorporated herein by reference.

BACKGROUND

1. Technical Field

The present disclosure relates to an EUV (extreme ultraviolet) light generation apparatus.

2. Related Art

In recent years, as semiconductor processes become finer, transfer patterns for use in photolithographies of semiconductor processes have rapidly become finer. In the next generation, microfabrication at 70 nm to 45 nm, further, microfabrication at 32 nm or less would be demanded. In order to meet the demand for microfabrication at 32 nm or less, for example, it is expected to develop an exposure device in which a system for generating EUV light at a wavelength of approximately 13 nm is combined with a reduced projection reflective optical system.

Three types of EUV light generation systems have been proposed, which include an LPP (laser produced plasma) type system using plasma generated by irradiating a target material with a laser beam, a DPP (discharge produced plasma) type system using plasma generated by electric discharge, and an SR (synchrotron radiation) type system using synchrotron orbital radiation.

CITATION LIST

Patent Literature

PTL1: U.S. Pat. No. 7,872,245
PTL2: U.S. Pat. No. 8,138,487
PTL3: U. S. Patent Application Publication No. 2012/0205559

SUMMARY

The extreme ultraviolet light generation apparatus according to one aspect of the present disclosure may include: a chamber in which extreme ultraviolet light is generated when a target is irradiated with a laser beam inside the chamber; a target supply part configured to supply the target into the chamber; and a target collector configured to collect the target which is supplied by the target supply part but is not irradiated with the laser beam in a collection container, by receiving the target on a receiving surface having a contact angle of greater than 90 degrees with the target.

BRIEF DESCRIPTION OF THE DRAWINGS

Hereinafter, selected embodiments of the present disclosure will be described with reference to the accompanying drawings by way of example.

FIG. 7 shows contact angles of various materials with respect to molten tin;

DESCRIPTION OF EXEMPLARY EMBODIMENTS

Figure 1:
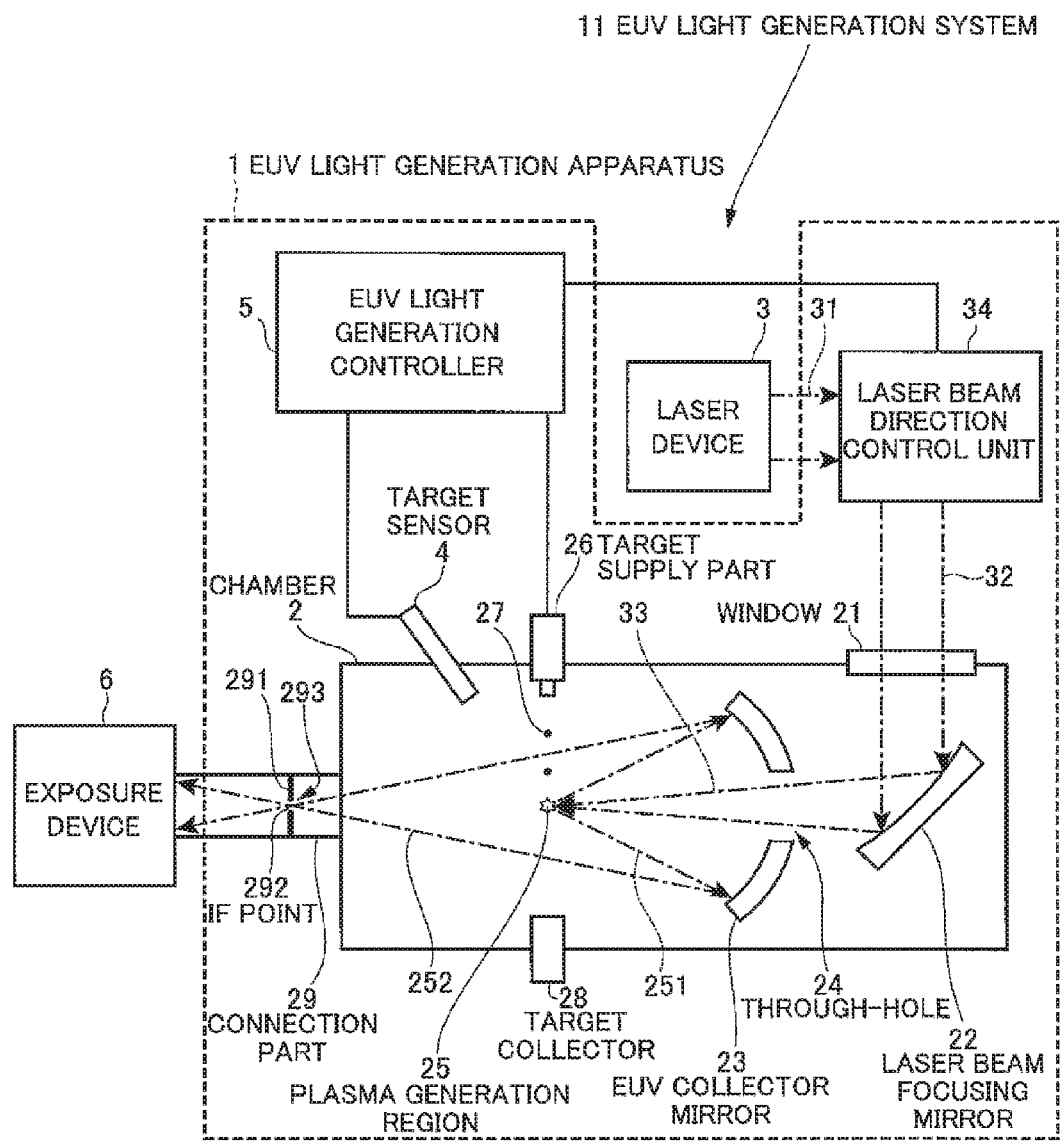
FIG. 1 schematically shows the configuration of an exemplary LPP type EUV light generation system.

<Contents>
1. Overview
2. Description of terms
3. Overview of the EUV light generation system
   3.1 Configuration
   3.2 Operation
4. EUV light generation apparatus including a target collector
   4.1 Configuration
   4.2 Operation
   4.3 Problem
5. Target collector of the EUV light generation apparatus according to Embodiment 1
   5.1 First example of the target collector
   5.2 Second example of the target collector
   5.3 Third example of the target collector
   5.4 Fourth example of the target collector
6. Target collector of the EUV light generation apparatus according to Embodiment 2
   6.1 Fifth example of the target collector
   6.2 Sixth example of the target collector
7. Target collector of the EUV light generation apparatus according to Embodiment 3
   7.1 Seventh example of the target collector
8. Others
   8.1 Hardware environment of each controller
   8.2 Modification Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Corresponding elements are referenced by corresponding reference numerals and characters, and therefore duplicate descriptions will be omitted.

1. Overview

The present disclosure may at least disclose the following embodiments.

An EUV light generation apparatus 1 of the present disclosure may include a chamber 2 in which EUV light 252 is generated when a target 27 is irradiated with a pulsed laser beam 33 inside the chamber 2, a target supply part 26 configured to supply the target 27 into the chamber 2, and a target collector 28 configured to collect the target 27 which is supplied by the target supply part 26 but is not irradiated with the pulsed laser beam 33 in a collection container 281, by receiving the target 27 on a receiving surface S having a contact angle of greater than 90 degrees with the target 27. Therefore, the EUV light generation apparatus 1 of the present disclosure can prevent fragmented materials 274 of the target 27 from dispersing to the outside of the target collector 28 when the target 27 that has not been irradiated with the pulsed laser beam 33 is collected.

2. Description Of Terms

"Target" refers to a substance which is introduced into the chamber and is irradiated with a laser beam. The target irradiated with a laser beam is turned into plasma and emits EUV light. "Droplet" refers to one form of the target supplied into the chamber.

3. Overview Of The Euv Light Generation System

3.1 Configuration

FIG. 1 schematically shows the configuration of an exemplary LPP type EUV light generation system. The EUV light generation apparatus 1 may be used with at least one laser device 3. In the present disclosure, the system including the EUV light generation apparatus 1 and the laser device 3 is referred to as an EUV light generation system 11. As shown in FIG. 1, and as described in detail later, the EUV light generation apparatus 1 may include the chamber 2 and the target supply part 26. The chamber 2 may be sealed airtight. The target supply part 26 may be mounted onto the chamber 2, for example, to penetrate a wall of the chamber 2. A target material to be supplied from the target supply part 26 may include, but is not limited to, tin, terbium, gadolinium, lithium, xenon, or a combination of any two or more of them.

The chamber 2 may have at least one through-hole in its wall. A window 21 may be provided on the through-hole. A pulsed laser beam 32 outputted from the laser device 3 may transmit through the window 21. In the chamber 2, an EUV collector mirror 23 having a spheroidal reflective surface may be provided. The EUV collector mirror 23 may have a first focusing point and a second focusing point. The surface of the EUV collector mirror 23 may have a multi-layered reflective film in which molybdenum layers and silicon layers are alternately laminated. The EUV collector mirror 23 may be preferably arranged such that the first focusing point is positioned in a plasma generation region 25 and the second focusing point is positioned in an intermediate focusing (IF) point 292. The EUV collector mirror 23 may have a through-hole 24 formed at the center thereof so that a pulsed laser beam 33 may pass through the through-hole 24.

The EUV light generation apparatus 1 may further include an EUV light generation controller 5 and a target sensor 4. The target sensor 4 may have an imaging function and detect the presence, trajectory, position and speed of the target 27.

Further, the EUV light generation apparatus 1 may include a connection part 29 that allows the interior of the chamber 2 to be in communication with the interior of an exposure device 6. In the connection part 29, a wall 291 having an aperture 293 may be provided. The wall 291 may be positioned such that the second focusing point of the EUV collector mirror 23 lies in the aperture 293.

The EUV light generation apparatus 1 may also include a laser beam direction control unit 34, a laser beam focusing mirror 22, and the target collector 28 for collecting the target 27. The laser beam direction control unit 34 may include an optical element for defining the traveling direction of the laser beam and an actuator for adjusting the position or the posture of the optical element.

3.2 Operation

With reference to FIG. 1, a pulsed laser beam 31 outputted from the laser device 3 may pass through the laser beam direction control unit 34, transmit through the window 21 as a pulsed laser beam 32, and then enter the chamber 2. The pulsed laser beam 32 may travel through the chamber 2 along at least one laser beam path, be reflected by the laser beam focusing mirror 22, and be applied to at least one target 27 as the pulsed laser beam 33.

The target supply part 26 may be configured to output the target 27 to the plasma generation region 25 in the chamber 2. The target 27 may be irradiated with at least one pulse of the pulsed laser beam 33. Upon being irradiated with the pulsed laser beam, the target 27 may be turned into plasma, and EUV light 251 may be emitted from the plasma together with the emission of light at different wavelengths. The EUV light 251 may be selectively reflected by the EUV collector mirror 23. EUV light 252 reflected by the EUV collector mirror 23 may be focused onto the IF point 292, and outputted to the exposure device 6. Here, one target 27 may be irradiated with multiple pulses of the pulsed laser beam 33.

The EUV light generation controller 5 may be configured to totally control the EUV light generation system 11. The EUV light generation controller 5 may be configured to process the image data of the target 27 captured by the target sensor 4. Further, the EUV light generation controller 5 may be configured to control at least one of: the timing at which the target 27 is outputted; and the direction in which the target 27 is outputted. Furthermore, the EUV light generation controller 5 may be configured to control at least one of: the timing at which the laser device 3 oscillates; the traveling direction of the pulsed laser beam 32; and the position on which the pulsed laser beam 33 is focused. The various controls described above are merely examples, and other controls may be added as necessary.

4. Euv Light Generation Apparatus Including The Target Collector

4.1 Configuration

Figure 2:
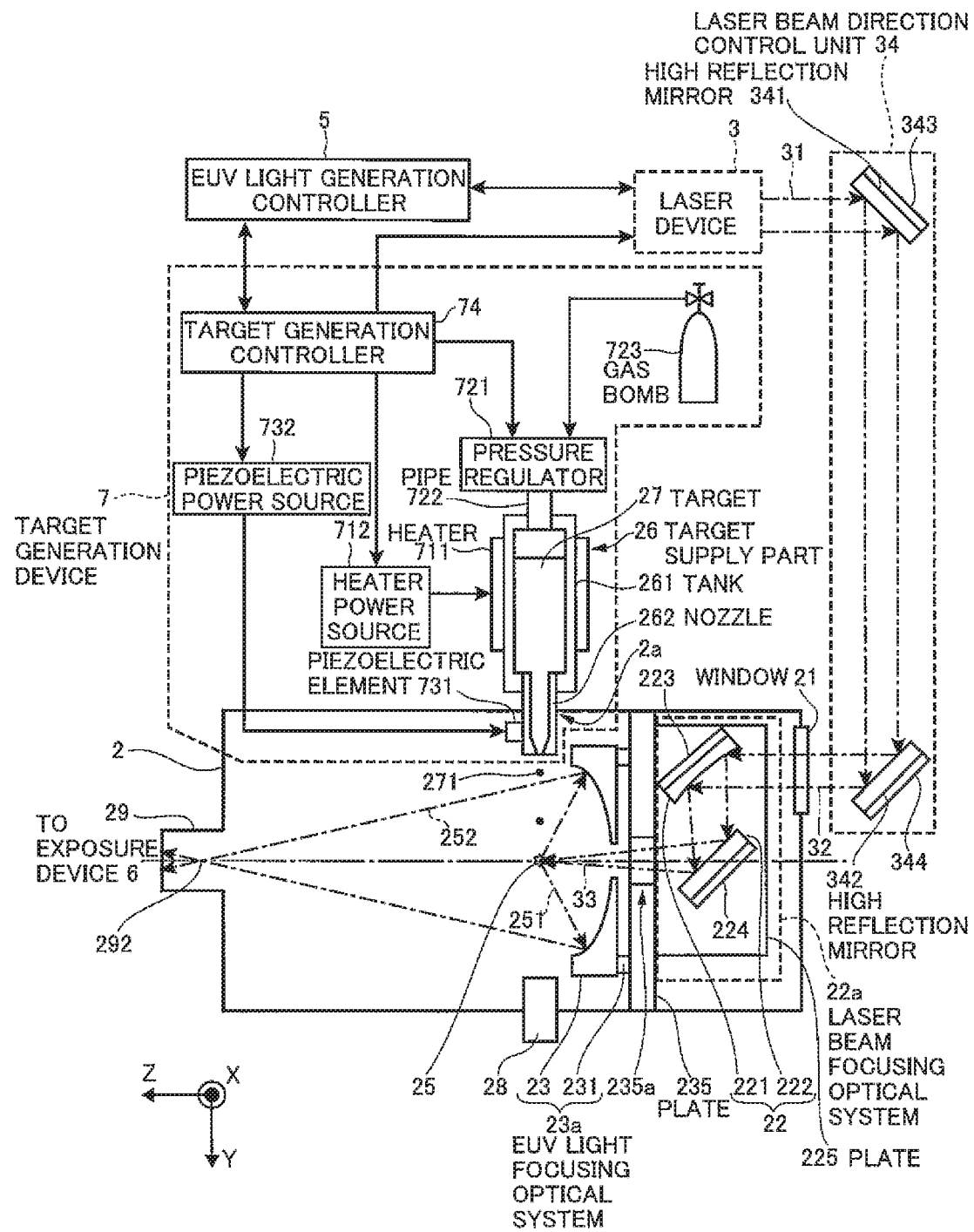
FIG. 2 shows the configuration of an EUV light generation apparatus including a target generation device.
Figure 3:
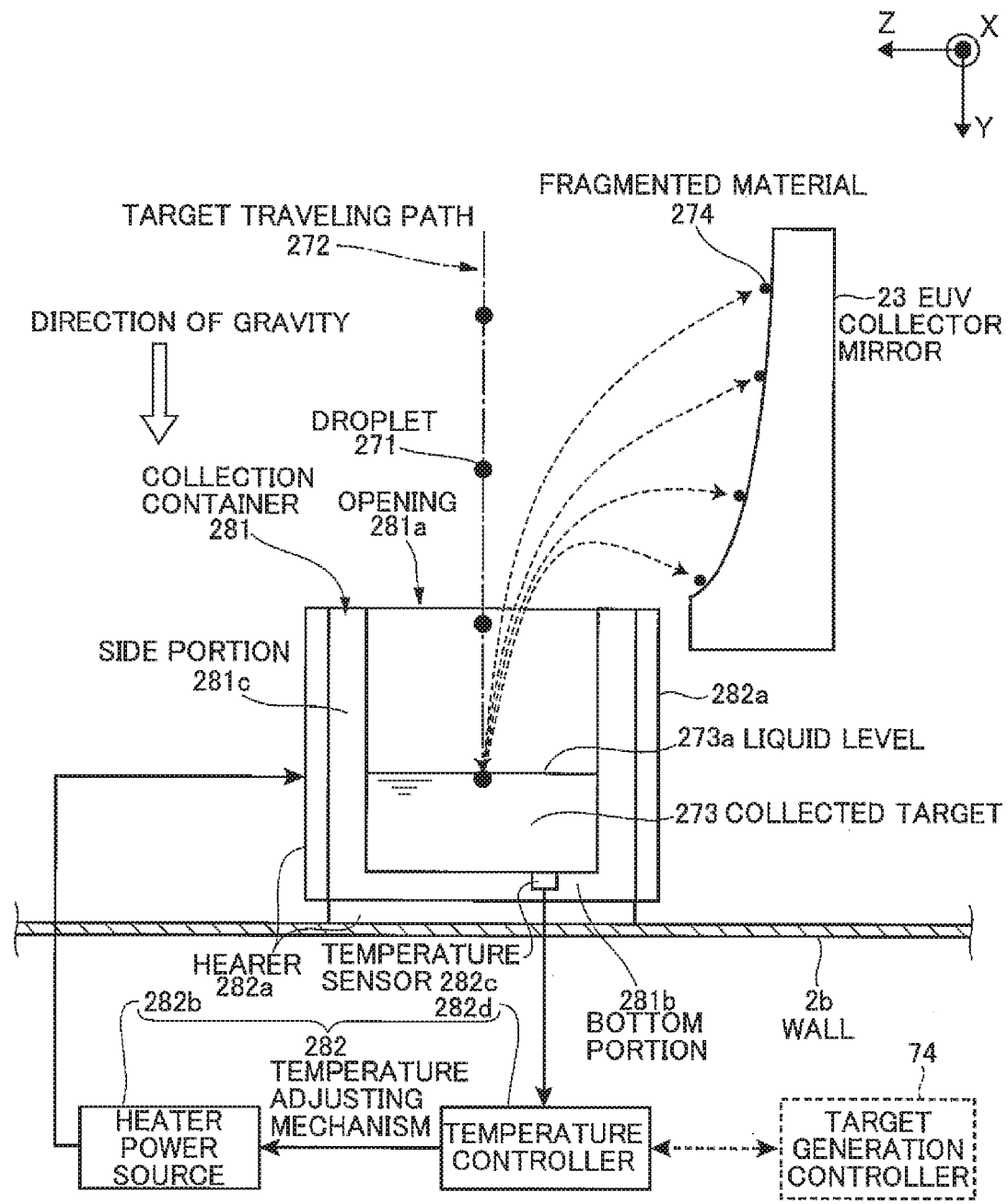
FIG. 3 shows the configuration of a target collector.

With reference to FIGS. 2 and 3, the configuration of the EUV light generation apparatus 1 including a target generation device 7 and the target collector 28 will be described. In FIG. 2, the direction in which the EUV light 252 is outputted from the chamber 2 of the EUV light generation apparatus 1 to the exposure device 6 is defined as a Z-axis. An X-axis and a Y-axis are orthogonal to the Z-axis and are orthogonal to one another. The same applies to the subsequent drawings.

The chamber 2 of the EUV light generation apparatus 1 may be formed in, for example, a hollow spherical shape or a hollow cylindrical shape. The direction of the central axis of the cylindrical chamber 2 may be the same as the direction in which the EUV light 252 is outputted to the exposure device 6.

The cylindrical chamber 2 may include a target supply hole 2a formed in its side portion, for supplying the target 27 into the chamber 2 from the outside of the chamber 2. If the chamber 2 is formed in a hollow spherical shape, the target supply hole 2a may be formed on the wall surface of the chamber 2 at a position in which the window 21 and the connection part 29 are not provided.

In the chamber 2, a laser beam focusing optical system 22a, an EUV light focusing optical system 23a, the target collector 28, a plate 225 and a plate 235 may be provided.

The plate 235 may be fixed to the inner surface of the chamber 2. A hole 235a that allows the pulsed laser beam 33 to pass therethrough may be formed at the center of the plate 235 in the thickness direction of the plate 235. The opening direction of the hole 235a may be the same as the direction of the axis passing through the through-hole 24 and the plasma generation region 25 shown in FIG. 1. The EUV light focusing optical system 23a may be provided on one surface of the plate 235. Meanwhile, on the other surface of the plate 235, the plate 225 may be provided via a triaxial stage (not shown).

The EUV light focusing optical system 23a provided on the one surface of the plate 235 may include the EUV collector mirror 23 and a holder 231. The holder 231 may hold the EUV collector mirror 23. The holder 231 holding the EUV collector mirror 23 may be fixed to the plate 235.

The plate 225 provided on the other surface of the plate 235 may be changed in its position and posture by the triaxial stage. The laser beam focusing optical system 22a may be provided on the plate 225.

The laser beam focusing optical system 22a may include the laser beam collector mirror 22, a holder 223 and a holder 224. The laser beam collector mirror 22 may include an off-axis paraboloidal mirror 221 and a plane mirror 222.

The holder 223 may hold the off-axis paraboloidal mirror 221. The holder 223 holding the off-axis paraboloidal mirror 221 may be fixed to the plate 225. The holder 224 may hold the plane mirror 222. The holder 224 holding the plane mirror 222 may be fixed to the plate 225.

The off-axis paraboloidal mirror 221 may be placed to face each of the window 21 provided on the bottom portion of the chamber 2 and the plane mirror 222. The plane mirror 222 may be placed to face each of the hole 235a and the off-axis paraboloidal mirror 221. The positions and postures of the off-axis paraboloidal mirror 221 and the plane mirror 222 may be adjusted by changing the position and posture of the plate 225. This adjustment may be performed such that the pulsed laser beam 33, which is a reflected beam of the pulsed laser beam 32 having entered the off-axis paraboloidal mirror 221 and the plane mirror 222, is focused on the plasma generation region 25.

The target collector 28 may be provided on the lateral side of the chamber 2. The target collector 28 may be disposed on the extension of a target traveling path 272 through which the target 27 outputted into the chamber 2 as a droplet 271 travels. As shown in FIG. 3, the target collector 28 may include the collection container 281 and a temperature adjusting mechanism 282. Here, the configurations of the collection container 281 and the temperature adjusting mechanism 282 will be described in detail later with reference to FIG. 3.

Meanwhile, the laser beam direction control unit 34, the EUV light generation controller 5 and the target generation device 7 may be provided outside the chamber 2.

The laser beam direction control unit 34 may be provided between the window 21 formed on the bottom portion of the chamber 2 and the laser device 3. The laser beam direction control unit 34 may include a high reflection mirror 341, a high reflection mirror 342, a holder 343 and a holder 344.

The holder 343 may hold the high reflection mirror 341. The holder 344 may hold the high reflection mirror 342. The positions and postures of the holders 343 and 344 may be changed by an actuator (not shown) connected to the EUV light generation controller 5.

The high reflection mirror 341 may be placed to face each of the exit aperture of the laser device 3 from which the pulsed laser beam 31 exits and the high reflection mirror 342. The high reflection mirror 342 may be placed to face each of the window 21 of the chamber 2 and the high reflection mirror 341. The positions and postures of the high reflection mirrors 341 and 342 may be adjusted by changing the positions and postures of the holders 343 and 344 by the EUV light generation controller 5. This adjustment may be performed such that the pulsed laser beam 32, which is the reflected beam of the pulsed laser beam 31 having entered the high reflection mirrors 341 and 342, transmits through the window 21 formed on the bottom portion of the chamber 2.

The EUV light generation controller 5 may send/receive control signals to/from the laser device 3 and control the operation of the laser device 3. The EUV light generation controller 5 may send/receive control signals to/from the actuators of the laser beam direction control unit 34 and the laser beam focusing optical system 22a. By this means, the EUV light generation controller 5 may adjust the traveling directions and the focusing positions of the pulsed laser beams 31 to 33. The EUV light generation controller 5 may send/receive control signals to/from a target generation controller 74 (described later) of the target generation device 7 and control the operation of the target generation device 7. Here, the hardware configuration of the EUV light generation controller 5 will be described later with reference to FIG. 15.

The target generation device 7 may be provided on the lateral side of the chamber 2. The target generation device 7 may include the target supply part 26, a heater 711, a heater power source 712, a pressure regulator 721, a pipe 722, a gas bomb 723, a piezoelectric element 731, a piezoelectric power source 732, and the target generation controller 74.

The target supply part 26 may include a tank 261 and a nozzle 262. The tank 261 may be formed in a hollow cylindrical shape. The hollow tank 261 may accommodate the target 27. At least the inner surface of the tank 261 accommodating the target 27 may be made of a material which is not easy to react with the target 27. The material which is not easy to react with the target 27 may be any of, for example, silicon carbide, silicon oxide, aluminium oxide, molybdenum, tungsten and tantalum.

The nozzle 262 may be provided on the bottom portion of the cylindrical tank 261. The nozzle 262 may be placed in the interior of the chamber 2 via the target supply hole 2a of the chamber 2.

The target supply hole 2a may be closed by providing the target supply part 26. By this means, it is possible to isolate the interior of the chamber 2 from the atmosphere. The interior of the nozzle 262 may be made of a material which is not easy to react with the target 27.

One end of the pipe-like nozzle 262 may be fixed to the hollow tank 261. A nozzle hole (not shown) may be formed in the other end of the pipe-like nozzle 262. The tank 261 provided on the one end side of the nozzle 262 may be placed outside the chamber 2. Meanwhile, the nozzle hole provided on the other end side of the nozzle 262 may be placed inside the chamber 2. The plasma generation region 25 and the target collector 28 placed inside the chamber 2 may be positioned on the extension of the central axis of the nozzle 262. The interiors of the tank 261, the nozzle 262 and the chamber 2 may communicate with each other. The nozzle hole may be formed in a shape that allows the molten target 27 to be jetted into the chamber 2.

The heater 711 may be fixed to the outer side portion of the cylindrical tank 261. The heater 711 fixed to the tank 261 may heat the tank 261. The heater 711 may be connected to the heater power source 712. The heater power source 712 may supply electric power to the heater 711. The heater power source 712 that supplies electric power to the heater 711 may be connected to the target generation controller 74. The power supply from the heater power source 712 to the heater 711 may be controlled by the target generation controller 74.

A temperature sensor (not shown) may be fixed to the outer side portion of the cylindrical tank 261. The temperature sensor fixed to the tank 261 may be connected to the target generation controller 74. The temperature sensor may detect the temperature of the tank 261 and output a detection signal to the target generation controller 74. The target generation controller 74 may control the electric power supplied to the heater 711 such that the temperature in the tank 261 is a target temperature, based on the detection signal outputted from the temperature sensor. By this means, it is possible to adjust the temperature in the tank 261 to the target temperature.

The pipe 722 may connect between the bottom portion of the cylindrical tank 261 on the opposite side of the nozzle 262 and the pressure regulator 721. The pipe 722 allows the target supply part 26 including the tank 261 and the pressure regulator 721 to communicate with one another. The pipe 722 may be covered with a heat insulating material (not shown). A heater (not shown) may be provided on the pipe 722. The temperature in the pipe 722 may be maintained at the same temperature as the temperature in the tank 261 of the target supply part 26.

The gas bomb 723 may be filled with inert gas such as helium, argon and so forth. The gas bomb 723 may supply the inert gas into the tank 261 via the pressure regulator 721.

The pressure regulator 721 may be provided on the bottom portion of the cylindrical tank 261 on the opposite side of the nozzle 262 via the pipe 722, as described above. The pressure regulator 721 may include solenoid valves for air supply and exhaust, a pressure sensor and so forth. The pressure regulator 721 may detect the pressure in the tank 261 by using the pressure sensor. The pressure regulator 721 may be connected to the gas bomb 723. The pressure regulator 721 may supply the inert gas filled in the gas bomb 723 to the tank 261. The pressure regulator 721 may be connected to an exhaust pump (not shown). The pressure regulator 721 may activate the exhaust pump to discharge the gas from the tank 261. The pressure regulator 721 may increase or decrease the pressure in the tank 261 by supplying/discharging the gas into/out of the tank 261.

The pressure regulator 721 may be connected to the target generation controller 74. The pressure regulator 721 may output a detection signal indicating the detected pressure to the target generation controller 74. A control signal outputted from the target generation controller 74 may be inputted to the pressure regulator 721. The control signal outputted from the target generation controller 74 may be a signal for controlling the operation of the pressure regulator 721 to regulate the pressure in the tank 261 at a target pressure, based on the detection signal outputted from the pressure regulator 721. The pressure regulator 721 may supply/discharge the gas into/out of the tank 261, based on the control signal from the target generation controller 74. By this means, it is possible to regulate the pressure in the tank 261 at the target pressure.

The piezoelectric element 731 may be fixed to the outer side portion of the pipe-like nozzle 262. The piezoelectric element 731 fixed to the nozzle 262 may cause a vibration of the nozzle 262. The piezoelectric element 731 that causes a vibration of the nozzle 262 may be connected to the piezoelectric power source 732. The piezoelectric power source 732 may supply electric power to the piezoelectric element 731. The piezoelectric power source 732 that supplies electric power to the piezoelectric element 731 may be connected to the target generation controller 74. The piezoelectric power source 732 may receive the control signal outputted from the target generation controller 74. The control signal outputted from the target generation controller 74 may be a control signal to cause the piezoelectric power source 732 to supply electric power with a predetermined waveform to the piezoelectric element 731. The piezoelectric power source 732 may supply electric power to the piezoelectric element 731, based on the control signal from the target generation controller 74. The piezoelectric element 731 may cause a vibration of the nozzle 262 according to the predetermined waveform. This allows a standing wave to be given to the flow of the jetted target 27 from the nozzle 262, and therefore it is possible to periodically divide the target 27. The divided target 27 may form a free interface by means of its own surface tension to form a droplet 271.

The target generation controller 74 may send/receive control signals to/from the EUV light generation controller 5 to totally control the entire operation of the target generation device 7. The target generation controller 74 may output a control signal to the heater power source 712 to control the operations of the heater power source 712 and the heater 711. The target generation controller 74 may output a control signal to the pressure regulator 721 to control the operations of the pressure regulator 721 and the gas bomb 723. The target generation controller 74 may output a control signal to the piezoelectric power source 732 to control the operations of the piezoelectric power source 732 and the piezoelectric element 731. The target generation controller 74 may output a control signal to a temperature controller 282d (described later) of the temperature adjusting mechanism 282 to control the operation of the temperature adjusting mechanism 282. Here, the hardware configuration of the target generation controller 74 will be described later with reference to FIG. 15.

With reference to FIG. 3, the configuration of the target collector 28 will be described. As described above, the target collector 28 may include the collection container 281 and the temperature adjusting mechanism 282.

The collection container 281 may collect the target 27 outputted into the chamber 2 as the droplet 271. This target 27 may be one of the targets 27 supplied to the plasma generation region 25 by the target supply part 26 but not irradiated with the pulsed laser beam 33. That is, the collection container 281 may collect one of the targets 27 which has been supplied by the target supply part 26 but not contributed to generation of the EUV light 251. The target 27 collected in the collection container 281 may be referred to as "collected target 273."

The collection container 281 may be formed in a cylindrical shape. The central axis of the cylindrical collection container 281 may match the target traveling path 272. An opening 281a of the collection container 281 may face the target supply part 26 and the plasma generation region 25. A bottom portion 281b of the collection container 281 may be located on the inner surface side of a wall 2b of the chamber 2. A side portion 281c of the collection container 281 may be provided to extend from the bottom portion 281b to the opening 281a. The collection container 281 may introduce the target 27 from the opening 281a into the inside of the collection container 281 and store the target 27 in a space formed by the bottom portion 281b and the side portion 281c. The collection container 281 may collect the target 27 inside the chamber 2.

The temperature adjusting mechanism 282 may adjust the temperature in the collection container 281. The temperature adjusting mechanism 282 may include a heater 282a, a heater power source 282b, a temperature sensor 282c and the temperature controller 282d.

The heater 282a may be provided to cover the outer surface of the collection container 281. The heater 282a may be fixed to the outer surfaces of the bottom portion 281b and the side portion 281c. The heater 282a fixed to the collection container 281 may heat the collection container 281. The heater 282a may be connected to the heater power source 282b. The heater power source 282b may supply electric power to the heater 282a. The heater power source 282b that supplies electric power to the heater 282a may be connected to the temperature controller 282d. The power supply from the heater power source 282b to the heater 282a may be controlled by the temperature controller 282d.

The temperature sensor 282c may be fixed to the bottom portion 281b or the side portion 281c of the collection container 281. The temperature sensor 282c may be embedded in and fixed to the inside of the bottom portion 281b or the side portion 281c. The temperature sensor 282c may be fixed to the inner surface of the bottom portion 281b or the side portion 281c, and directly contact the collected target 273. The temperature sensor 282c may be connected to the temperature controller 282d. The temperature sensor 282c may detect the temperature of the collection container 281 and output a detection signal to the temperature controller 282d.

The detection signal outputted from the temperature sensor 282c may be inputted to the temperature controller 282d. The temperature controller 282d may be connected to the target generation controller 74. The temperature controller 282d may output the detection signal outputted from the temperature sensor 282c to the target generation controller 74. The control signal outputted from the target generation controller 74 may be inputted to the temperature controller 282d. The control signal outputted from the target generation controller 74 may be a signal for controlling the operation of the heater power source 282b to make the temperature in the collection container 281 be the target temperature, based on the detection signal outputted from the temperature sensor 282c. The control signal may contain a temperature setting value to make the temperature in the collection container 281 be the target temperature. The temperature controller 282d may control the electric power supplied from the heater power source 282b to the heater 282a, according to the temperature setting value contained in the control signal from the target generation controller 74. By this means, it is possible to adjust the temperature in the collection container 281 to the target temperature.

The target temperature may be equal to or higher than the melting point of the target 27. When the target 27 is tin, the target temperature may be, for example, equal to or higher than 232 degrees Celsius and lower than 270 degrees Celsius. Alternatively, the target temperature may be equal to or higher than 270 degrees Celsius. The collection container 281 having the temperature adjusted to the target temperature can melt the collected target 273.

4.2 Operation

Figure 4:
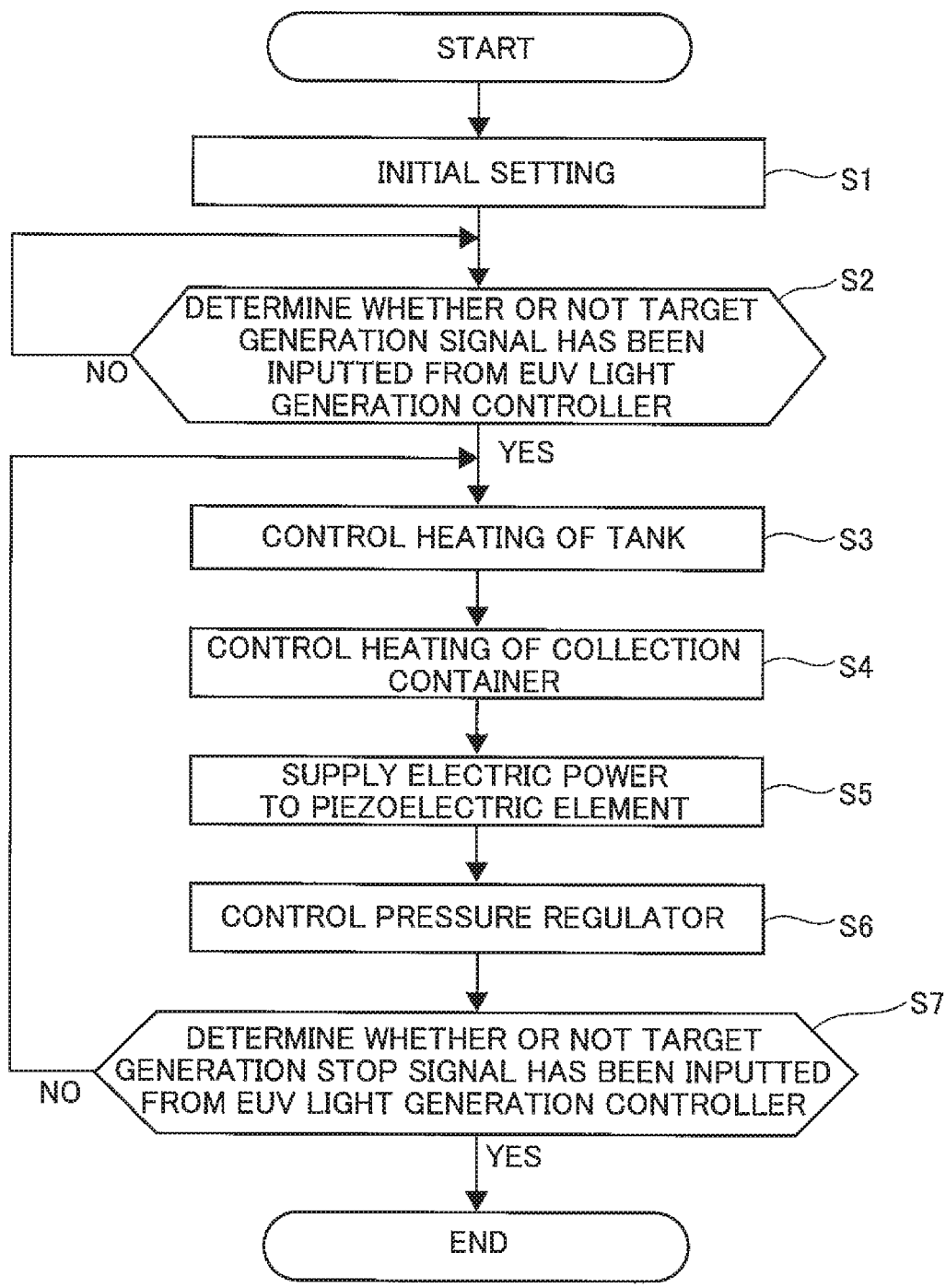
FIG. 4 is a flowchart explaining a process for the target supply performed by a target generation controller.

With reference to FIG. 4, the outline of the operation of the EUV light generation apparatus 1 including the target generation device 7 will be described. To be more specific, a process for target supply performed by the target generation controller 74 will be described with reference to FIGS. 2 to 4. When a start signal to activate the target generation device 7 is inputted from the EUV light generation controller 5 to the target generation controller 74, the target generation controller 74 may perform the following process.

In step S1, the target generation controller 74 may perform initial setting for the target generation device 7. The target generation controller 74 may activate each component of the target generation device 7 and perform operation check on each of the components. Then, the target generation controller 74 may initialize each of the components and set an initial setting value in each of the components.

Particularly, the target generation controller 74 may set an initial pressure setting value of the pressure regulator 721 to make the pressure in the tank 261 have a pressure value approximate to the value of the vacuum state. The pressure value approximate to the value of the vacuum state may be, for example, 1 hPa. The gas in the tank 261, which is easy to react with the target 27, may be discharged before the target 27 has molten. In this case, the inert gas in the gas bomb 723 may be supplied into the tank 261 several times to purge the tank 261.

Moreover, the target generation controller 74 may set an initial temperature setting value of the heater 711 to make the temperature of the target 27 have a value equal to or higher than the melting point of the target 27. The initial temperature setting value of the heater 711 may be, for example, equal to or higher than 232 degrees Celsius and lower than 270 degrees Celsius.

Furthermore, the target generation controller 74 may cause the temperature controller 282d to set an initial temperature setting value of the heater 282a to make the temperature of the collected target 273 have a value equal to or higher than the melting point of the target 27 when the target 27 is collected. The initial temperature setting value of the heater 282a may be equal to or higher than 232 degrees Celsius and lower than 270 degrees Celsius.

In step S2, the target generation controller 74 may determine whether or not a target generation signal has been inputted from the EUV light generation controller 5. The target generation signal may be a control signal to cause the target generation device 7 to supply the target 27 to the plasma generation region 25 in the chamber 2. The target generation controller 74 may wait until the target generation signal is inputted. The target generation controller 74 may continuously control the heating by the heater 711 to maintain the temperature in the tank 261 within a predetermined range of temperatures equal to or higher than the melting point of the target 27. The target generation controller 74 may continuously control the heating by the heater 282a to maintain the temperature in the collection container 281 within a predetermined range of temperatures equal to or higher than the melting point of the target 27. When determining that the target generation signal has been inputted, the target generation controller 74 may move the step to step S3.

In the step S3, the target generation controller 74 may check the temperature in the tank 261. The target generation controller 74 may appropriately correct the temperature setting value to control the heating by the heater 711. The target 27 stored in the tank 261 may be heated to a temperature equal to or higher than its melting point. The heated target 27 may be molten.

In step S4, the target generation controller 74 may check the temperature of the collection container 281. The target generation controller 74 may cause the temperature controller 282*d* to appropriately correct the temperature setting value to control the heating by the heater 282*a*. The collected target 273 collected in the collection container 281 may be heated to a temperature equal to or higher than its melting point. The heated collected target 273 may be molten.

In step S5, the target generation controller 74 may cause the piezoelectric power source 732 to supply electric power to the piezoelectric element 731. The piezoelectric element 731 may cause a vibration of the nozzle 262. If the molten target 27 is jetted from the nozzle hole, the molten target 27 is divided due to the vibration of the nozzle 262 so that the droplet 271 can be formed. Here, the target generation controller 74 may control the operation of the piezoelectric power source 732 to supply electric power with a predetermined waveform to the piezoelectric element 731. This predetermined waveform may be a waveform with which the droplet 271 is formed at a predetermined generation frequency. The predetermined generation frequency may be, for example, 50 kHz to 100 kHz.

In step S6, the target generation controller 74 may set a pressure setting value in the pressure regulator 721 so that the pressure in the tank 261 allows the target 27 to be supplied. The pressure regulator 721 may regulate the pressure in the tank 261 at the pressure setting value set as above. The pressure at which the target 27 can be supplied may be a pressure at which a constant amount of the molten target 27 jets from the nozzle hole and reaches the plasma generation region 25 at a predetermined speed. The predetermined speed may be, for example, 60 m/s to 100 m/s. The pressure may be applied to the molten target 27 in the tank 261. The target 27 under pressure may flow from the tank 261 to the nozzle 262, and a constant amount of the target 27 may be jetted from the nozzle hole. The constant amount of the target 27 jetted from the nozzle hole may be vibrated by the piezoelectric element 731 for a constant cycle, so that it is possible to form the uniform droplet 271 for the constant cycle. The droplets 271 formed may be outputted into the chamber 2. The diameter of the droplet 271 may be, for example, 20 µm to 30 µm.

The EUV light generation controller 5 may control the timing at which the pulsed laser beam 31 is outputted from the laser device 3 such that the pulsed laser beam 33 is emitted to the plasma generation region 25 at the same time at which the droplet 271 reaches the plasma generation region 25. The droplet 271 reaching the plasma generation region 25 may be irradiated with the pulsed laser beam 33 being emitted to the plasma generation region 25. The droplet 271 irradiated with the pulsed laser beam 33 may be turned into plasma and generate the EUV light 251.

Meanwhile, the droplet 271 not irradiated with the pulsed laser beam 33 may travel on the target traveling path 272 through the plasma generation region 25 and reach the target collector 28. The droplet 271 having reached the target collector 28 may enter the opening 281*a* of the collection container 281 and be stored in the collection container 281. In this case, the temperature of the collection container 281 may be maintained within a predetermined range of temperatures equal to or higher than the melting point of the target 27. Therefore, the droplet 271 having entered the collection container 281 may be stored in the collection container 281, as the molten collected target 273.

In step S7, the target generation controller 74 may determine whether or not a target generation stop signal has been inputted from the EUV light generation controller 5. The target generation stop signal may be a control signal to cause the target generation device 7 to stop supplying the target 27 to the plasma generation region 25. When determining that the target generation stop signal has not been inputted, the target generation controller 74 may move the step to the step S3. On the other hand, when determining that the target generation stop signal has been inputted, the target generation controller 74 may end this process.

4.3 Problem

The EUV light generation apparatus 1 can supply the target 27 as a plurality of droplets 271 to the plasma generation region 25. The EUV light generation apparatus 1 irradiates the target 27 reaching the plasma generation region 25 with the pulsed laser beam 33 to turn the target 27 into plasma, so that the EUV light 251 can be generated. However, the EUV light generation apparatus 1 may not necessarily irradiate all the targets 27 reaching the plasma generation region 25 with the pulsed laser beam 33. The targets 27 not irradiated with the pulsed laser beam 33 may be collected by the target collector 28. When the target 27 not irradiated with the pulsed laser beam 33 is collected by the target collector 28, the target 27 may enter the collection container 281 from the opening 281*a*.

At this time, the target 27 having entered the collection container 281 may collide against a liquid level 273*a* of the collected target 273 stored in the collection container 281 as shown in FIG. 3. The molten collected target 273 forming the liquid level 273*a* may be broken into splashes by the impact of the collision against the target 27 and jump out as fragmented materials 274. Then, the fragmented materials 274 may pass through the opening 281*a* and disperse to the outside of the target collector 28.

Even when the molten collected target 273 is not stored in the collection container 281, the target 27 having entered the collection container 281 may collide against the bottom portion 281*b* or the side portion 281*c*. When colliding against the bottom portion 281*b* or the side portion 281*c*, the target 27 may be crushed on the surface of the bottom portion 281*b* or the side portion 281*c* and jump out as the fragmented materials 274. Otherwise, the target 27 crushed on the bottom portion 281*b* or the side portion 281*c* may stay on and stick to the bottom portion 281*b* or the side portion 281*c*. When the target 27 newly entering the collection container 281 collides against the previous target 27 stuck on the bottom portion 281*b* or the side portion 281*c*, it may be crushed on and stick to the previous target 27, and then jump out as the fragmented materials 274. Then, the fragmented materials 274 may pass through the opening 281*a* and disperse to the outside of the target collector 28.

Each of the fragmented materials 274 may be a fine particle having a diameter of about several µm. The fragmented materials 274 may adhere to various optical systems provided in the chamber 2 and thereby deteriorate their performance. In particular, if the fragmented materials 274 adhere to the EUV collector mirror 23 provided in the chamber 2, the reflectivity of the EUV collector mirror 23 may be decreased. The decrease in the reflectivity of the EUV collector mirror 23 may cause power reduction of the EUV light 251, which may cause a problem. Therefore, there is a demand for a technology that can efficiently collect the target 27 not irradiated with the pulsed laser beam 33, while preventing the fragmented materials 274 from dispersing to the outside of the target collector 28.

5. Target Collector Of The Euv Light Generation Apparatus According To Embodiment 1

With reference to FIGS. 5 to 10, the target collector 28 of the EUV light generation apparatus 1 according to Embodiment 1 will be described.

When collecting the target 27, the target collector 28 of the EUV light generation apparatus 1 according to Embodiment 1 may change the trajectory of the target 27 having entered the target collector 28. In addition, the target collector 28 of the EUV light generation apparatus 1 according to Embodiment 1 may prevent the target 27 having entered the target collector 28 from staying on and sticking to the position where the target 27 collides against the target collector 28. Hereinafter, first to fourth examples of the target collector 28 of the EUV light generation apparatus 1 according to Embodiment 1 will be described. The configurations of the first to fourth examples of the target collector 28, which are the same as those of the target collector 28 shown in FIGS. 2 and 3, will not be described again here.

5.1 First Example of the Target Collector

Figure 5:
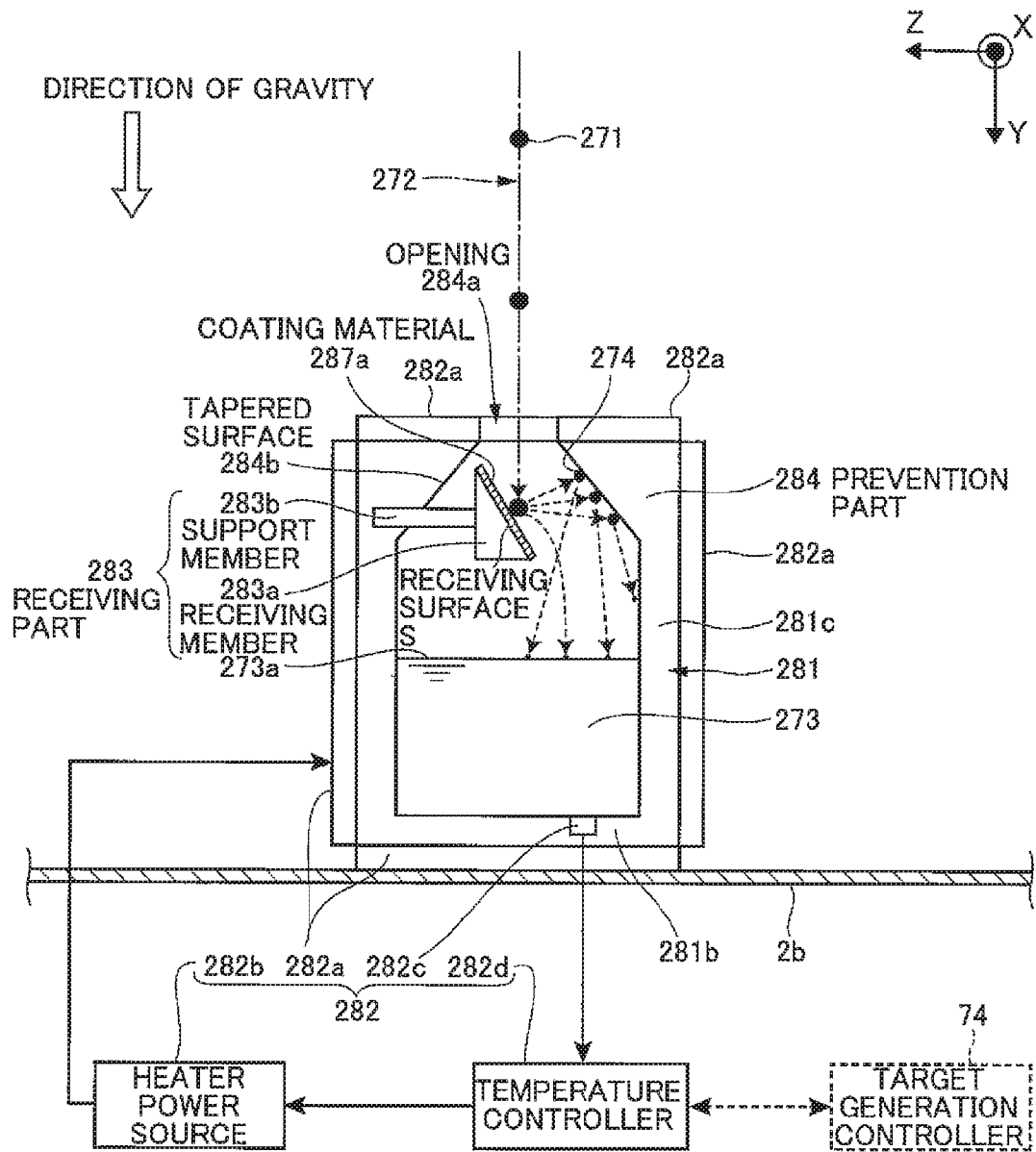
FIG. 5 shows the configuration of a first example of the target collector.
Figure 6:
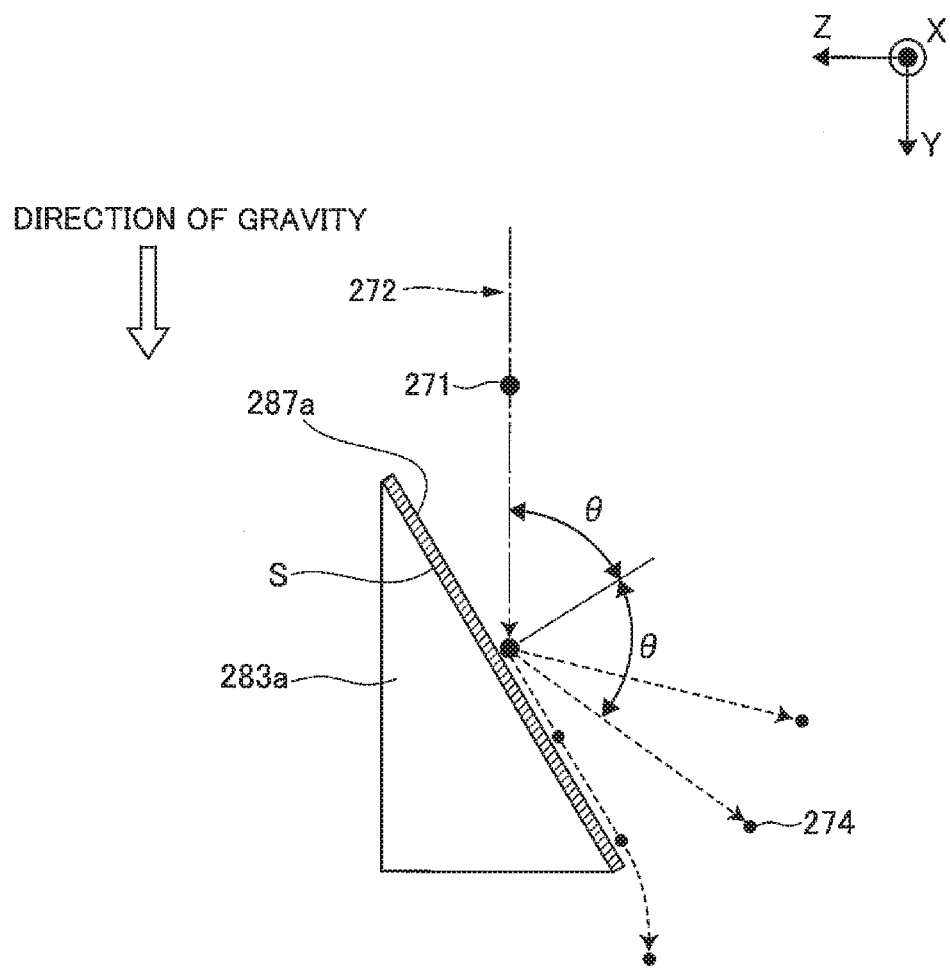
FIG. 6 is a drawing explaining a situation in which the target collides against a receiving surface of a receiving member.

With reference to FIGS. 5 to 7, the configuration of the first example of the target collector 28 will be described. As shown in FIG. 5, the first example of the target collector 28 may include the collection container 281, the temperature adjusting mechanism 282, a receiving part 283, and a prevention part 284. The configurations of the first example of the target collector 28 shown in FIG. 5, which are the same as those of the target collector 28 shown in FIG. 3, will not be described again here.

The configuration of the collection container 281 shown in FIG. 5 may be the same as that of the collection container 281 shown in FIG. 3. The configuration of the temperature adjusting mechanism 282 shown in FIG. 5 may be the same as that of the temperature adjusting mechanism 282 shown in FIG. 3.

The receiving part 283 may receive the target 27 having entered the target collector 28. The receiving part 283 may be provided inside the collection container 281. The receiving part 283 may include a receiving member 283a and a support member 283b. The target 27 having entered the target collector 28 may collide directly against the receiving member 283a, and therefore be received by the receiving member 283a. The receiving member 283a may include a receiving surface S configured to receive the target 27 having entered the target collector 28.

The receiving surface S of the receiving member 283a may be located on the extension of the target traveling path 272. The receiving surface S may be disposed to face the target supply part 26 and the plasma generation region 25. The receiving surface may be inclined with respect to the target traveling path 272 with a predetermined inclination angle. The inclination angle of the receiving surface S may be provided to prevent the fragmented materials 274 generated by the collision of the target 27 incident on the receiving surface S from dispersing to the outside of the target collector 28. The receiving surface S is provided to incline with the predetermined inclination angle, and therefore can change the trajectory of the target 27 having entered the target collector 28. Here, the situation where the target 27 collides against the receiving surface S of the receiving member 283a will be described later with reference to FIG. 6.

The receiving surface S of the receiving member 283a may be coated with a coating material 287a. The coating material 287a may have a contact angle of greater than 90 degrees with the liquid target 27. The receiving surface S coated with the coating material 287a is not easy to be wetted by the target 27 having entered the target collector 28. Therefore, after being crushed on the receiving surface S, the target 27 may move on the receiving surface S toward the bottom portion 281b side by gravity and reach the collection container 281. By this means, the target 27 having entered the target collector 28 is not easy to stay on and stick to the receiving surface S. Here, the coating material 287a will be described in detail later with reference to FIG. 7.

The support member 283b may detachably fix the receiving member 283a to the collection container 281. The support member 283b may be formed integrally with the receiving member 283a.

The prevention part 284 may prevent the target 27 received by the receiving part 283 from dispersing to the outside of the target collector 28. The prevention part 284 shown in FIG. 5 may prevent the fragmented materials 274 generated by the collision of the target 27 incident on the receiving surface S from dispersing to the outside of the target collector 28. The prevention part 284 may be formed integrally with the collection container 281. The prevention part 284 may be formed in a cylindrical shape. The central axis of the cylindrical prevention part 284 may match the central axis of the collection container 281. The cylindrical prevention part 284 may be formed to extend from the periphery of the opening 281a of the collection container 281 as the base end, toward the target supply part 26 and the plasma generation region 25. The cylindrical prevention part 284 may be formed such that its inside diameter is reduced toward the target supply part 26 and the plasma generation region 25.

The inner periphery of the prevention part 284 may be a tapered surface 284b having an inside diameter that is reduced toward the target supply part 26 and the plasma generation region 25. The tapered surface 284b may face the bottom portion 281b or the side portion 281c of the collection container 281. The tapered surface 284b may face the receiving surface S of the receiving member 283a. The inclination angle of the tapered surface 284b with respect to the target traveling path 272 may be equal to or greater than the inclination angle of the receiving surface S with respect to the target traveling path 272. The tapered surface 284b may be parallel to the receiving surface S of the receiving member 283a. The tapered surface 284b may reflect the fragmented materials 274 of the target 27 incident on the receiving surface S toward the bottom portion 281b side. By this means, it is possible to prevent the fragmented materials 274 from dispersing to the outside of the target collector 28.

An opening 284a may be formed in the upper end of the prevention part 284 located on the target supply part 26 side. The diameter of the opening 284a may be sufficiently greater than that of the target 27. The diameter of the opening 284a may be, for example, 30 mm. The opening 284a may allow the target 27 having entered the target collector 28 to be guided to the receiving member 283a of the receiving part 283.

With reference to FIG. 6, the situation where the target 27 collides against the receiving surface S of the receiving member 283a will be described.

The target 27 may enter the target collector 28 at an incidence angle θ with respect to the normal direction of the receiving surface S, and collide against the receiving surface S. At this time, the target 27 may be crushed by the impact of the collision against the receiving surface S. The crushed target 27 is divided into the target 27 traveling on the receiving surface S and the fragmented materials 274 being reflected by the receiving surface S and dispersing. The fragmented materials 274 may be a plurality of fine particles.

The fragmented materials 274 being the plurality of fine particles may be spread out in a conical shape having the central axis corresponding to the direction of a reflection angle θ which is the same as the incidence angle θ of the target 27. These fragmented materials 274 may be further reflected by the tapered surface 284*b* of the prevention part 284 toward the bottom portion 281*b* side as shown in FIG. 5. The fragmented materials 274 reflected by the tapered surface 284*b* may reach the collection container 281.

The inclination angle of the receiving surface S with respect to the target traveling path 272 may be provided such that the incidence angle θ of the target 27 satisfies 0°<θ<90°. If the inclination angle of the receiving surface S is provided to make the incidence angle θ of the target 27 be θ=0°, the receiving surface S may be orthogonal to the target traveling path 272. Therefore, the fragmented materials 274 generated by the collision of the target 27 against the receiving surface S may pass through the opening 284*a* and disperse to the outside of the target collector 28.

If the inclination angle of the receiving surface S is provided to make the incidence angle θ of the target 27 be θ=90°, the receiving surface S may be parallel to the target traveling path 272. Therefore, the target 27 having entered the target collector 28 may not be received by the receiving surface S but collide directly against the liquid level 273*a* of the collected target 273. The collected target 273 forming the liquid level 273*a* may be broken into splashes by the impact of the collision against the target 27 and jump out as the fragmented materials 274. Then, the fragmented materials 274 may pass through the opening 284*a* and disperse to the outside of the target collector 28.

As described above, the inclination angle of the receiving surface S with respect to the target traveling path 272 may be provided such that the incidence angle θ of the target 27 satisfies 0°<θ<90°. More preferably, the inclination angle of the receiving surface S with respect to the target traveling path 272 may be provided such that the incidence angle θ of the target 27 satisfies 45°<θ<90°. At this time, the inclination angle of the receiving surface S with respect to the target traveling path 272 may be sharper. Therefore, the fragmented materials 274 generated by the collision of the target 27 against the receiving surface S may be easy to disperse to the bottom portion 281*b* side of the collection container 281. In addition, the fragmented materials 274 are easy to be reflected by part of the tapered surface 284*b* of the prevention part 284 on the bottom portion 281*b* side. Then, the fragmented materials 274 reflected by the part of the tapered surface 284*b* on the bottom portion 281*b* side may be easy to reach the collection container 281. Therefore, it is possible to more effectively prevent the fragmented materials 274 from dispersing to the outside of the target collector 28.

With reference to FIG. 7, the coating material 287*a* will be described in detail. FIG. 7 is a table showing contact angles of various materials with molten tin. The table shown in FIG. 7 was made based on "Wettability Technology Handbook—Fundamentals, Measurement valuation, Data" (supervisors: Toshio Ishii, Masumi Koishi, and Mitsuo Tsunoda, published by Technosystem). Generally, a state in which a contact angle α satisfies 0°<α≤90° is referred to as "immersional wetting." In this state, a solid is easy to be wetted by liquid. Under the immersional wetting state, a solid is easy to be immersed in the liquid. Meanwhile, a state in which the contact angle α satisfies 90°<α≤180° is referred to as "adhesional wetting." In this state, a solid is not easy to be wetted by liquid. Under the adhesional wetting state, the liquid in contact with the solid surface is easy to move in the direction of gravity.

The target 27 may be tin. The target 27 entering the target collector 28 may be molten tin formed of the droplet 271. The coating material 287*a* applied to the receiving surface S of the receiving member 283*a* may be a material that is not easy to be wetted by molten tin. The material that is not easy to be wetted by molten tin may have a contact angle of greater than 90 degrees with the target 27.

As shown in FIG. 7, the materials having contact angles of greater than 90 degrees with the target 27 may be, for example, silicon carbide, silicon oxide, silicon nitride, aluminium oxide, zirconium oxide, carbon material, and molybdenum oxide which has not been vacuum heat treated. The carbon material may include, for example, graphite, diamond, glassy carbon, and diamond-like carbon. Here, when molybdenum oxide is vacuum heat treated, the adsorption layer and the oxide layer of its surface are removed, and therefore the molybdenum oxide may be easy to be wetted by the molten tin.

Here, a material having a contact angle of greater than 90 degrees with the target 27 is not limited to be used as the coating material 287*a* applied to the receiving surface S of the receiving member 283*a*. The material having a contact angle of greater than 90 degrees may be used as a material for forming the receiving member 283*a* itself. When graphite is used as a material for forming the receiving member 283*a* itself, the surface of the receiving member 283*a* may be coated with a coating material having low dusting characteristics and a contact angle of greater than 90 degrees with the target 27. The material having low dusting characteristics and having a contact angle of greater than 90 degrees with the target 27 may be, for example, diamond, glassy carbon, diamond-like carbon, silicon carbide, silicon nitride, aluminium oxide, zirconium oxide, or silicon oxide.

Since the first example of the target collector 28 has the above-described configuration, the target 27 having entered the target collector 28 may collide directly against the receiving surface S of the receiving member 283*a*. When colliding against the receiving surface S, the target 27 may be crushed. The crushed target 27 may be divided into the target 27 traveling on the receiving surface S and the fragmented materials 274 that are reflected by the receiving surface S and disperse. Since the receiving surface S is coated with the coating material 287*a*, the target 27 traveling on the receiving surface S may not stay on and stick to the receiving surface S, but move to the bottom portion 281*b* side along the receiving surface S. Then, the target 27 moving to the bottom portion 281*b* side along the receiving surface S may fall from the receiving surface S and reach the collection container 281. Therefore, it is possible to prevent the target 27 newly entering the target collector 28 from colliding against the previous target 27 stuck on the receiving surface S. As a result, it is possible to prevent the target 27 newly entering the target collector 28 from sticking to the previous target 27 stuck on the receiving surface S, and also prevent the target 27 from dispersing as the fragmented materials 274. Meanwhile, the fragmented materials 274 reflected by the receiving surface S and dispersing may be further reflected by the tapered surface 284*b* of the prevention part 284 toward the bottom portion 281*b* side. The fragmented materials 274 reflected by the tapered surface 284*b* may reach the collection container 281. In this way, the first example of the target collector 28 can prevent the fragmented materials 274 from dispersing to the outside of the target collector 28.

5.2 Second Example of the Target Collector

Figure 8:
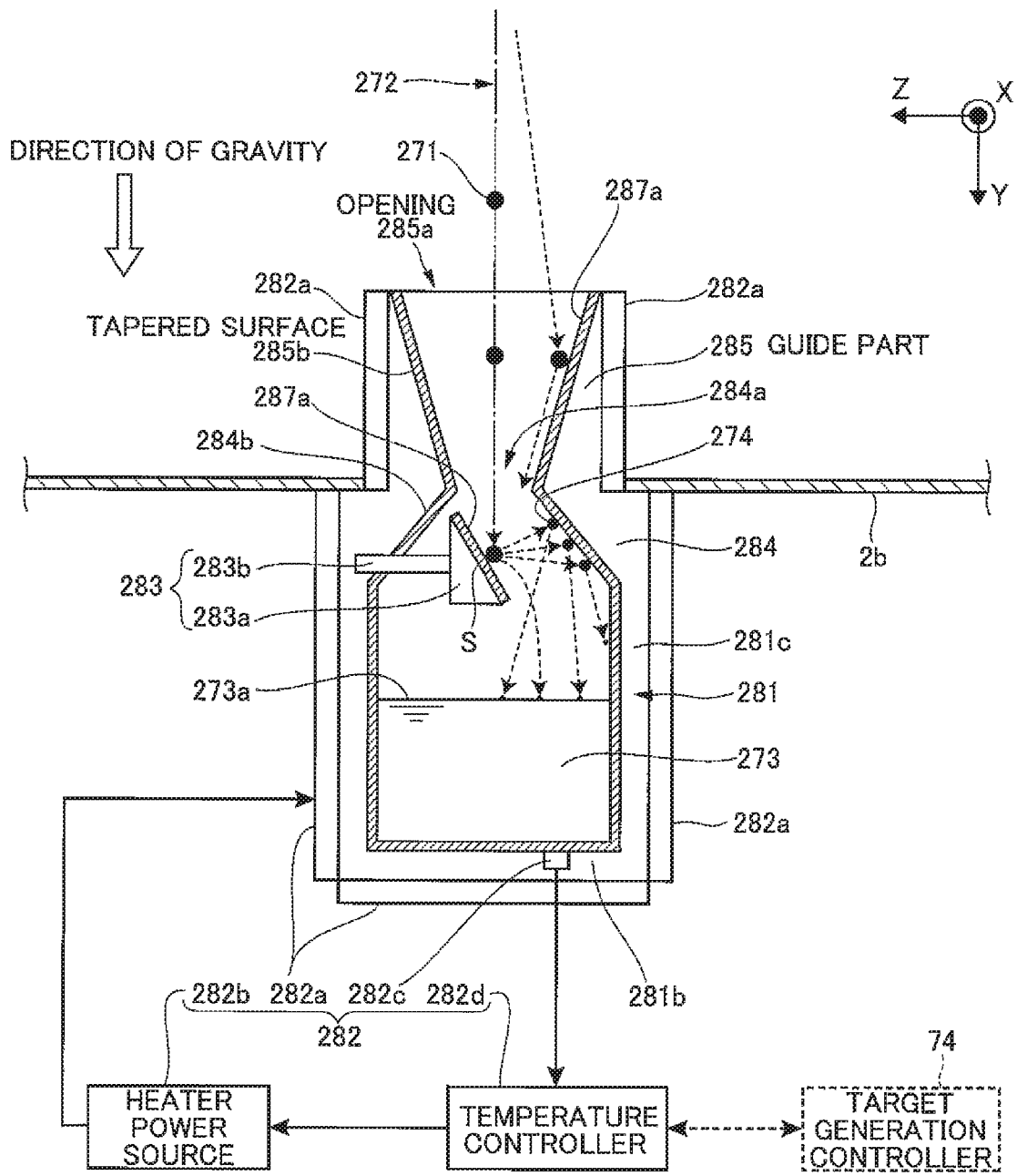
FIG. 8 shows the configuration of a second example of the target collector.

With reference to FIG. 8, the configuration of the second example of the target collector 28 will be described. As shown in FIG. 8, the second example of the target collector 28 may include the collection container 281, the temperature adjusting mechanism 282, the receiving part 283, the prevention part 284, and a guide part 285. The configurations of the second example of the target collector 28 shown in FIG. 8, which are the same as those of the first example of the target collector 28 shown in FIG. 5, will not be described again here.

The configuration of the temperature adjusting mechanism 282 shown in FIG. 8 may be the same as that of the temperature adjusting mechanism 282 shown in FIG. 5. The configuration of the receiving part 283 shown in FIG. 8 may be the same as that of the receiving part 283 shown in FIG. 5.

The inner surfaces of the bottom portion 281*b* and the side portion 281*c* of the collection container 281 shown in FIG. 8 may be coated with the coating material 287*a*. The collection container 281 may be disposed outside the chamber 2. The other configuration of the collection container 281 may be the same as the configuration of the collection container 281 shown in FIG. 5.

The tapered surface 284*b* of the prevention part 284 shown in FIG. 8 may be coated with the coating material 287*a*. The prevention part 284 may be disposed outside the chamber 2. The other configuration of the prevention part 284 may be the same as the configuration of the prevention part 284 shown in FIG. 5.

The guide part 285 may introduce the target 27 entering the target collector 28 not through the target traveling path 272, into the opening 281*a* of the collection container 281 or the opening 284*a* of the prevention part 284. The guide part 285 may be disposed inside the chamber 2. The guide part 285 may be formed integrally with the prevention part 284 and the collection container 281. The guide part 285 may be formed in a cylindrical shape. The central axis of the cylindrical guide part 285 may match the central axis of the collection container 281. The cylindrical guide part 285 may be formed to extend from the periphery of the opening 284*a* of the prevention part 284 as the base end, toward the target supply part 26 and the plasma generation region 25. The cylindrical guide part 285 may be formed such that its inside diameter is increased toward the target supply part 26 and the plasma generation region 25.

The inner periphery of the guide part 285 may be a tapered surface 285*b* having an inside diameter that is increased toward the target supply part 26 and the plasma generation region 25.

The tapered surface 285*b* may be coated with the coating material 287*a*. The tapered surface 285*b* may face the target supply part 26 and the plasma generation region 25. The tapered surface 285*b* may face the receiving surface S of the receiving member 283*a*. The inclination angle of the tapered surface 285*b* with respect to the target traveling path 272 may be equal to or smaller than the inclination angle of the receiving surface S with respect to the target traveling path 272. The tapered surface 285*b* may reflect the target 27 entering the target collector 28 not through the target traveling path 272, toward the opening 284*a* of the prevention part 284 located on the bottom portion 281*b* side. By this means, it is possible to introduce the target 27 entering the target collector 28 not through the target traveling path 272 into the opening 284*a*.

An opening 285*a* may be formed in the upper end of the guide part 285 located on the target supply part 26 side. The diameter of the opening 285*a* may be greater than that of the opening 284*a* of the prevention part 284. The opening 285*a* may allow the target 27 entering the target collector 28 through the target traveling path 272 to be introduced into the opening 284*a*. In addition, the opening 285*a* may allow the target 27 entering the target collector 28 not through the target traveling path 272, to be introduced into the opening 284*a* by way of the tapered surface 285*b*. The target 27 introduced into the opening 284*a* may be received by the receiving member 283*a* of the receiving part 283.

Since the second example of the target collector 28 has the above-described configuration, the target 27 having entered the target collector 28 not through the target traveling path 272, may collide against the tapered surface 285*b* of the guide part 285. When colliding against the tapered surface 285*b*, the target 27 may be crushed. The crushed target 27 may not stay on the tapered surface 285*b* coated with the coating material 287*a* but be reflected toward the bottom portion 281*b* side. The target 27 reflected by the tapered surface 285*b* may be introduced into the opening 284*a* of the prevention part 284. Meanwhile, with the second example of the target collector 28, the target 27 entering the target collector 28 through the target traveling path 272 may be introduced into the opening 284*a* of the prevention part 284 not by way of the tapered surface 285*b* of the guide part 285. The target 27 introduced into the opening 284*a* may collide against the receiving surface S of the receiving member 283*a* of the receiving part 283. In the same way as the first example of the target collector 28, the target 27 colliding against the receiving surface S may not stick to the receiving surface S but move to the bottom portion 281*b* side, or reach the collection container 281 by way of the tapered surface 284*b* of the prevention part 284. Therefore, in the same way as the first example of the target collector 28, the second example of the target collector 28 can prevent the fragmented materials 274 from dispersing to the outside of the target collector 28. Moreover, even if the target 27 enters the target collector 28 not through the target traveling path 272, the second example of the target collector 28 can collect the target 27, preventing the target 27 from dispersing to the outside of the target collector 28.

5.3 Third Example of the Target Collector

Figure 9:
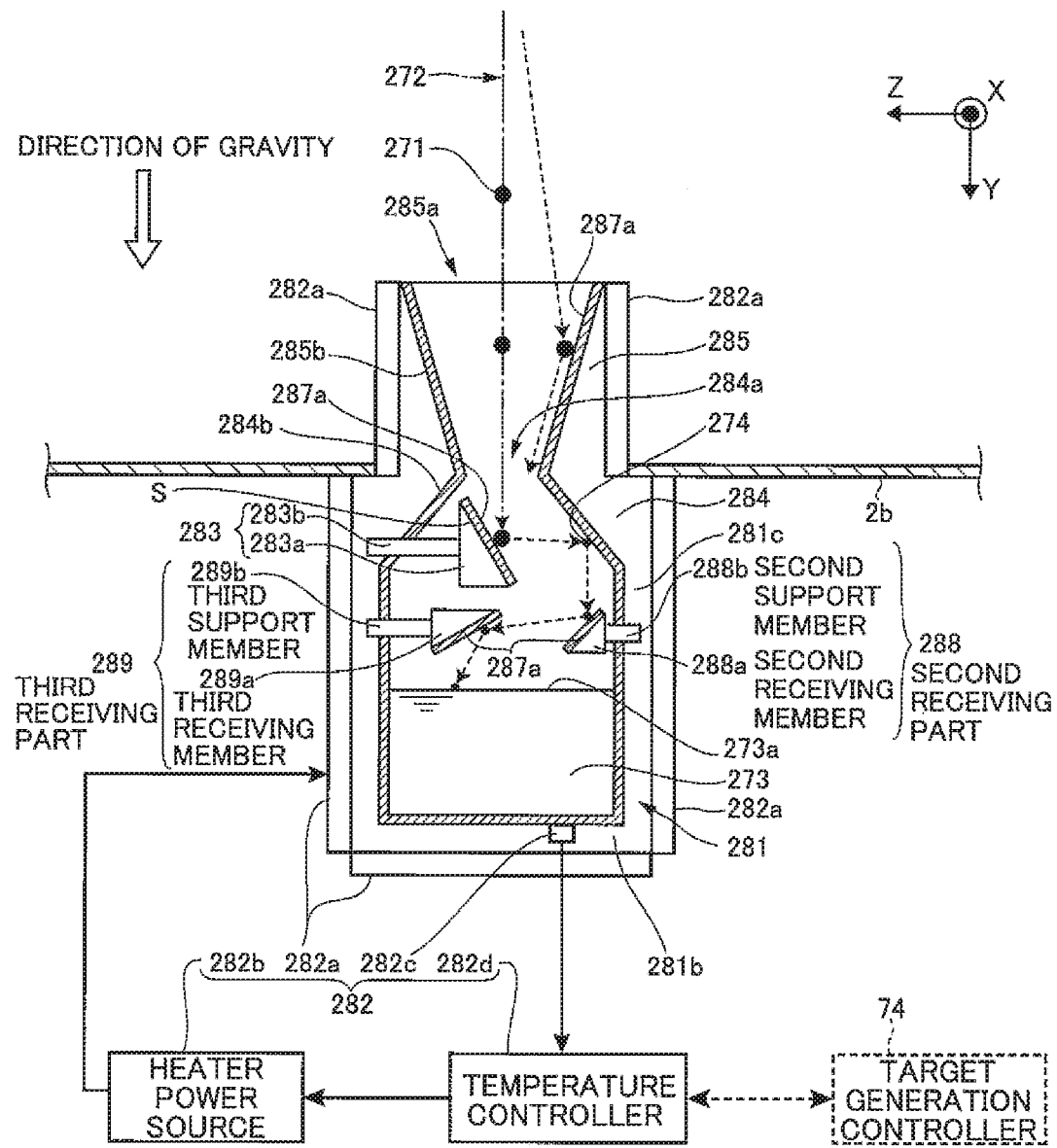
FIG. 9 shows the configuration of a third example of the target collector.

With reference to FIG. 9, the configuration of the third example of the target collector 28 will be described. As shown in FIG. 9, the third example of the target collector 28 may include the collection container 281, the temperature adjusting mechanism 282, the receiving part 283, a second receiving part 288, a third receiving part 289, the prevention part 284, and the guide part 285. The configurations of the third example of the target collector 28 shown in FIG. 9, which are the same as those of the second example of the target collector 28 shown in FIG. 8, will not be described again here.

The configuration of the collection container 281 shown in FIG. 9 may be the same as that of the collection container 281 shown in FIG. 8. The configuration of the temperature adjusting mechanism 282 shown in FIG. 9 may be the same as that of the temperature adjusting mechanism 282 shown in FIG. 8. The configuration of the receiving part 283 shown in FIG. 9 may be the same as that of the receiving part 283 shown in FIG. 8. The configuration of the prevention part 284 shown in FIG. 9 may be the same as that of the prevention part 284 shown in FIG. 8. The configuration of the guide part 285 shown in FIG. 9 may be the same as that of the guide part 285 shown in FIG. 8.

The second receiving part 288 shown in FIG. 9 may receive the fragmented materials 274 reflected by the tapered surface 284*b* of the prevention part 284. The second receiving part 288 may include a second receiving member 288*a* and a second support member 288*b*.

The second receiving member 288a may include a surface to receive the fragmented materials 274 reflected by the tapered surface 284b. The surface to receive the fragmented materials 274 reflected by the tapered surface 284b may face the tapered surface 284b and the third receiving part 289. In addition, the surface to receive the fragmented materials 274 reflected by the tapered surface 284b may be inclined with respect to the target traveling path 272 with a predetermined inclination angle. The surface to receive the fragmented materials 274 reflected by the tapered surface 284b may be coated with the coating material 287a.

The second receiving member 288a may reflect the fragmented materials 274 reflected by the tapered surface 284b, toward the third receiving part 289.

The second support member 288b may detachably fix the second receiving member 288a to the collection container 281. The second support member 288b may be formed integrally with the second receiving member 288a.

The third receiving part 289 shown in FIG. 9 may receive the fragmented materials 274 reflected by the second receiving member 288a of the second receiving part 288. The third receiving part 289 may include a third receiving member 289a and a third support member 289b.

The third receiving member 289a may include a surface to receive the fragmented materials 274 reflected by the second receiving member 288a. The surface to receive the fragmented materials 274 reflected by the second receiving member 288a may face the second receiving member 288a and the bottom portion 281b. The surface to receive the fragmented materials 274 reflected by the second receiving member 288a may be inclined with respect to the target traveling path 272 with a predetermined inclination angle. The surface to receive the fragmented materials 274 reflected by the second receiving member 288a may be coated with the coating material 287a. The third receiving member 289a may reflect the fragmented materials 274 reflected by the second receiving member 288a to the bottom portion 281b.

The third support member 289b may detachably fix the third receiving member 289a to the collection container 281. The third support member 289b may be formed integrally with the third receiving member 289a.

The other configurations of the second receiving part 288 and the third receiving part 289 may be the same as the configuration of the receiving part 283.

Since the third example of the target collector 28 has the above-described configuration, the fragmented materials 274 reflected by the tapered surface 284b of the prevention part 284 can be further reflected several times toward the bottom portion 281b side, and then reach the collection container 281. When the fragmented materials 274 reflected by the tapered surface 284b are further reflected several times, they may be crushed into finer particles and reduced in speed. When the fragmented materials 274 crushed into finer particles and reduced in speed collide against the liquid level 273a of the collected target 273, the impact of the collision of the fragmented materials 274 against the liquid level 273a may be reduced. Therefore, the fragmented materials 274 of the collected target 273 forming the liquid level 273a are not easy to jump out. Moreover, the receiving part 283, the second receiving part 288, and the third receiving part 289 may block a route through which the fragmented materials 274 of the collected target 273 travel to the outside of the target collector 28. Therefore, the third example of the target collector 28 can more effectively prevent the fragmented materials 274 from dispersing to the outside of the target collector 28 than the second example of the target collector 28.

5.4 Fourth Example of the Target Collector

Figure 10:
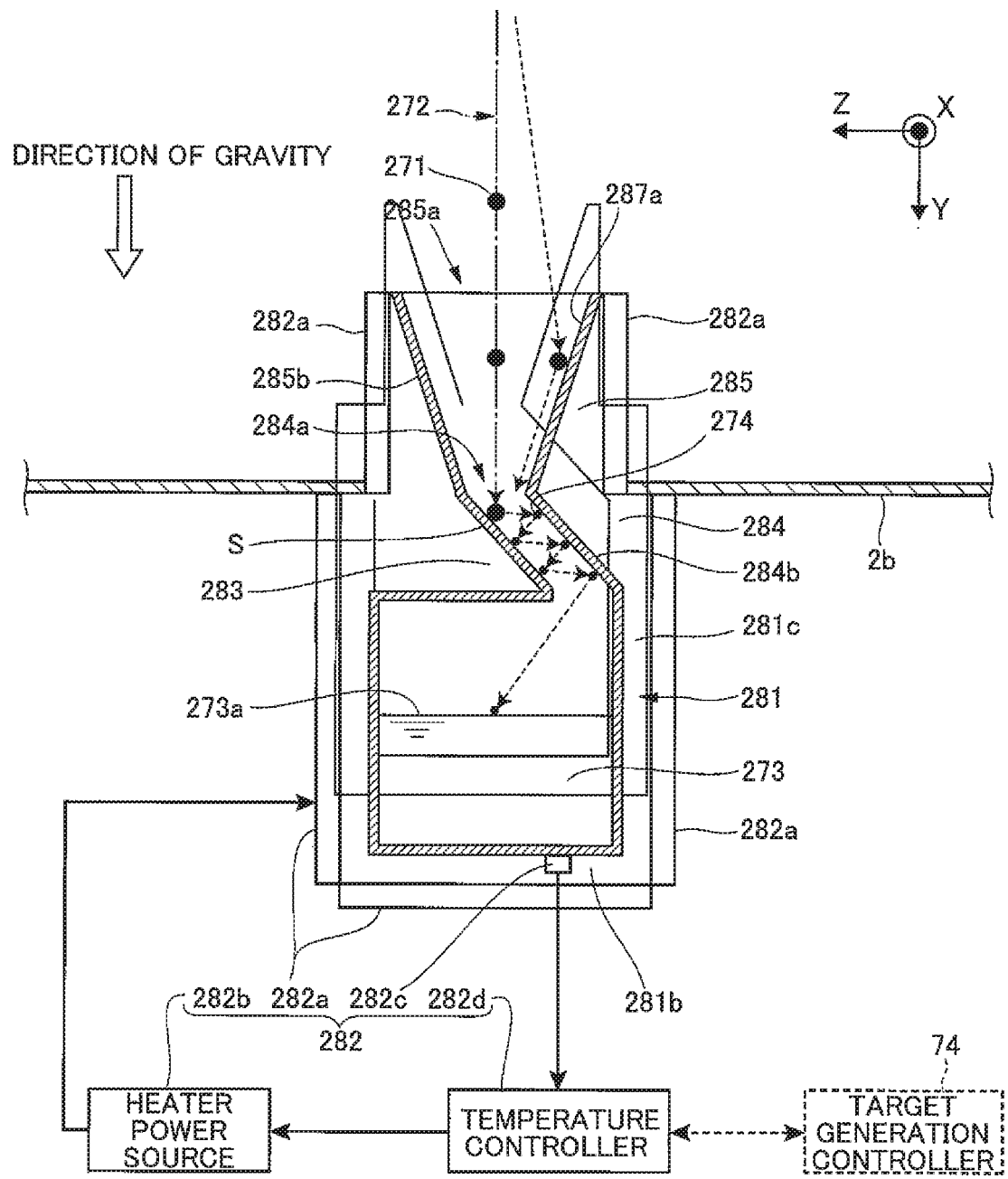
FIG. 10 shows the configuration of a fourth example of the target collector.

With reference to FIG. 10, the configuration of the fourth example of the target collector 28 will be described. As shown in FIG. 10, the fourth example of the target collector 28 may include the collection container 281, the temperature adjusting mechanism 282, the receiving part 283, the prevention part 284, and the guide part 285. The configurations of the target collector 28 shown in FIG. 10, which are the same as those of the second example of the target collector 28 shown in FIG. 8, will not be described again here.

The configuration of the collection container 281 shown in FIG. 10 may be the same as that of the collection container 281 shown in FIG. 8. The configuration of the temperature adjusting mechanism 282 shown in FIG. 10 may be the same as that of the temperature adjusting mechanism 282 shown in FIG. 8. The configuration of the guide part 285 shown in FIG. 10 may be the same as that of the guide part 285 shown in FIG. 8.

The receiving part 283 shown in FIG. 10 may not necessarily be constituted by the receiving member 283a and the support member 283b which are individual members separate from the collection container 281, like the receiving member 283 shown in FIG. 8. The receiving part 283 shown in FIG. 10 may be formed integrally with the collection container 281.

The receiving part 283 shown in FIG. 10 may be formed such that the receiving surface S protrudes inward from part of the inner periphery of the side portion 281c of the collection container 281. The receiving part 283 and the prevention part 284 shown in FIG. 10 may form a pipe line having an inner wall surface formed by at least the receiving surface S of the receiving part 283 and the tapered surface 284b of the prevention part 284. This pipe line may allow the communication between the guide part 285 and the collection container 281. This pipe line may allow the target 27 having entered the target collector 28 to be reflected by its inner wall surface several times, and then to be introduced into the collection container 281.

The other configurations of the receiving part 283 and the prevention part 284 shown in FIG. 10 may be the same as those of the receiving part 283 and the prevention part 284 shown in FIG. 8.

With the above-described configuration, the fourth example of the target collector 28 can reflect the target 27 a greater number of times than the second example of the target collector 281, and then introduce the target 27 into the collection container 28, in the same way as the third example of the target collector 28. Therefore, the fourth example of the target collector 28 can more effectively prevent the fragmented materials 274 from dispersing to the outside of the target collector 28 than the second target collector 28. Moreover, the fourth example of the target collector 28 is composed of a smaller number of parts and has a simpler structure than the third example of the target collector 28, and therefore can reduce the costs.

6. Target Collector of the EUV Light Generation Apparatus According to Embodiment 2

Figure 11:
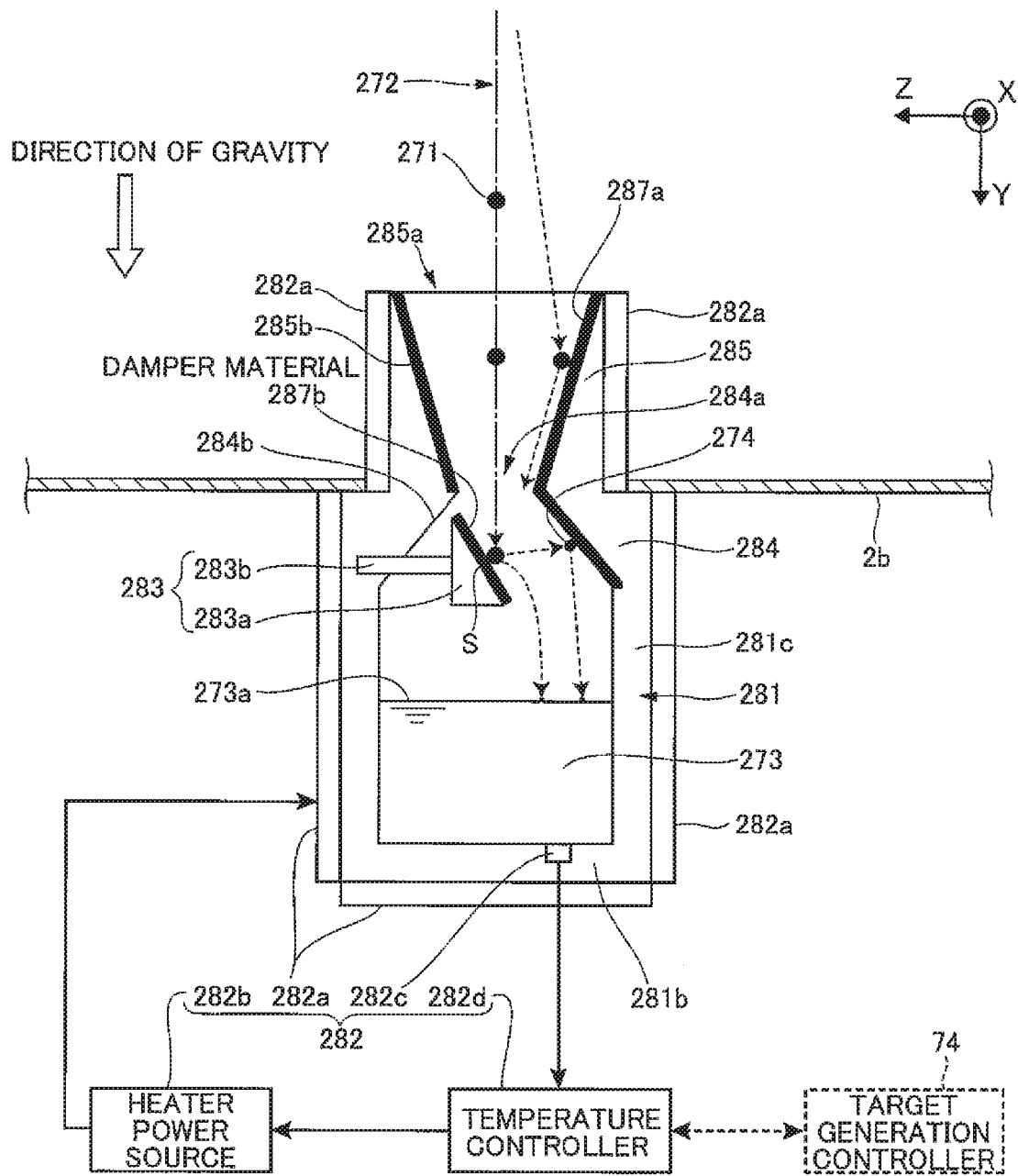
FIG. 11 shows the configuration of a fifth example of the target collector.
Figure 12:
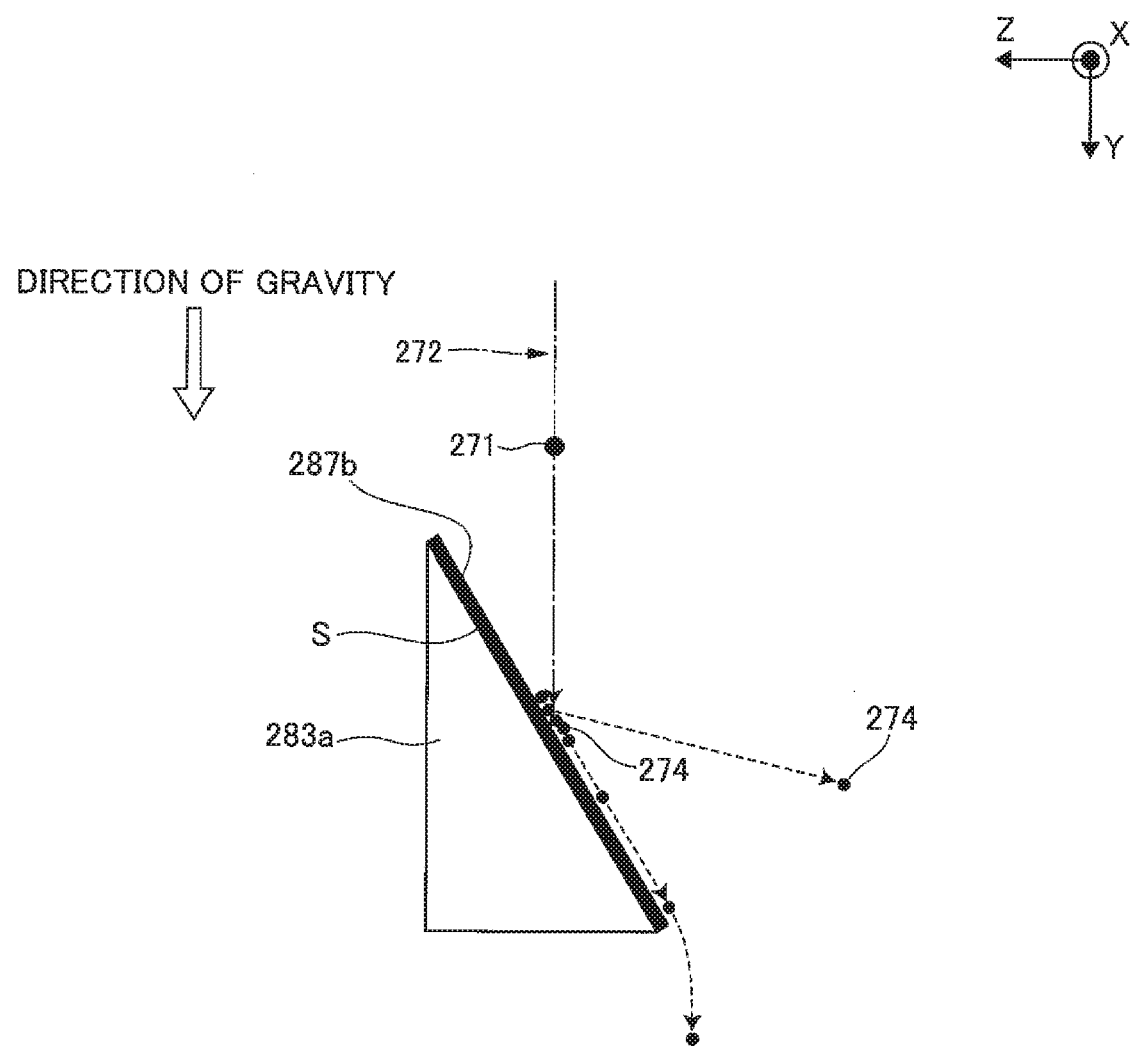
FIG. 12 is a drawing explaining a situation in which the target collides against the receiving surface of the receiving member covered with a damper material.
Figure 13:
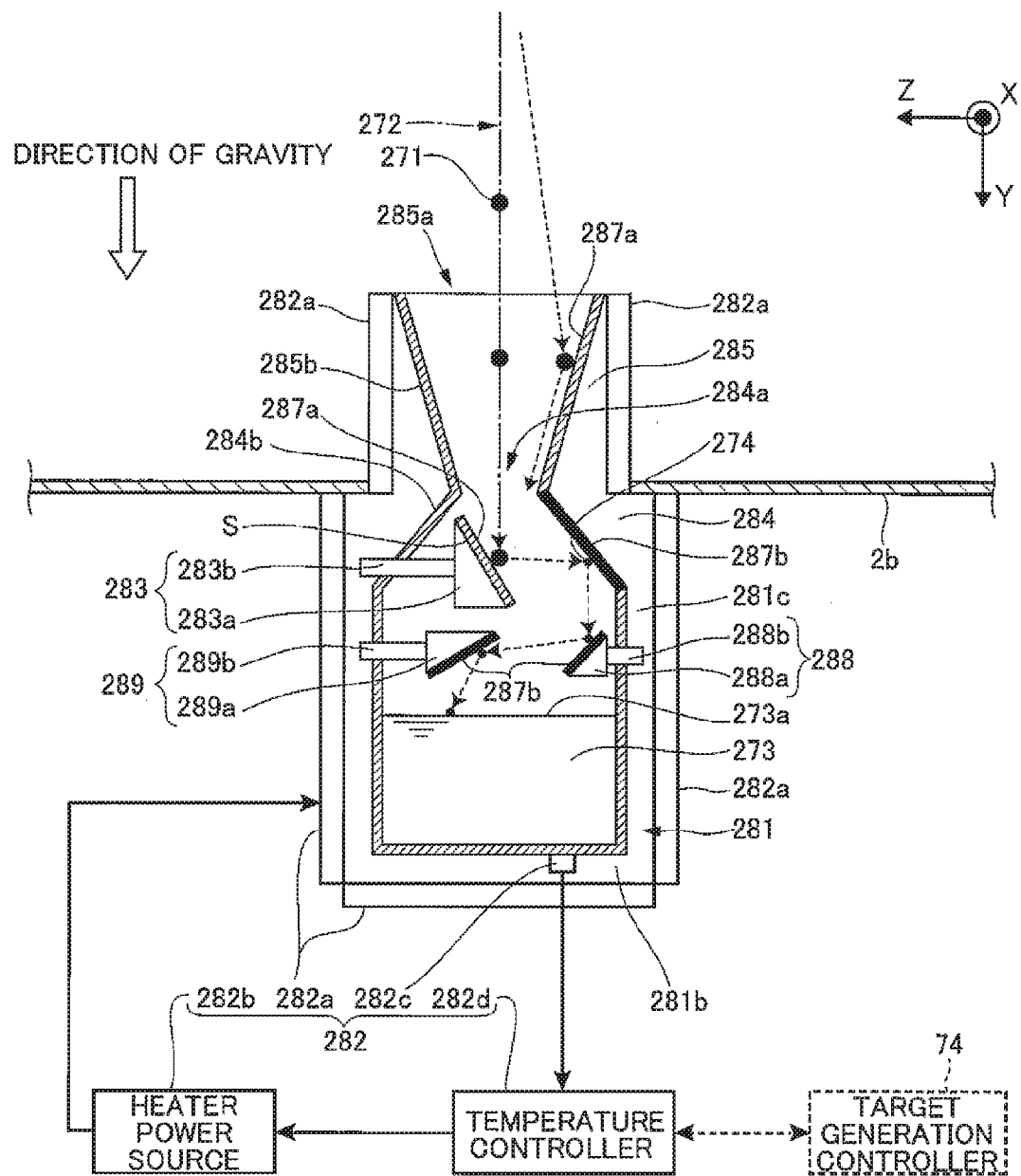
FIG. 13 shows the configuration of a sixth example of the target collector.

With reference to FIGS. 11 to 13, the target collector 28 of the EUV light generation apparatus 1 according to Embodiment 2 will be described.

When the target collector 28 of the EUV light generation apparatus 1 according to Embodiment 2 collects the target 27, it may change the trajectory of the target 27 entering the target collector 28. In addition, the target collector 28 of the EUV light generation apparatus 1 according to Embodiment 2 may prevent the target 27 having entered the target collector 28 from staying on and sticking to the position where the target 27 collides against the target collector 28. Moreover, the target collector 28 of the EUV light generation apparatus 1 according to Embodiment 2 may reduce the impact of the collision of the target 27 against the target collector 28 when the target 27 enters the target collector 28. Hereinafter, the target collector 28 of the EUV light generation apparatus 1 according to Embodiment 2 will be explained as fifth and sixth examples of the target collector 28. The configurations of the target collector 28, which are the same as those of the target collector 28 shown in FIGS. 2 and 3, and those of the first to fourth examples of the target collector 28 shown in FIGS. 5 to 10, will not be described again here.

6.1 Fifth Example of the Target Collector

With reference to FIGS. 11 and 12, the configuration of the fifth example of the target collector 28 will be described. As shown in FIG. 11, the fifth example of the target collector 28 may include the collection container 281, the temperature adjusting mechanism 282, the receiving part 283, the prevention part 284, and the guide part 285. The configurations of the fifth example of the target collector 28 shown in FIG. 11, which are the same as those of the second example of the target collector 28 shown in FIG. 8, will not be described again here.

The configuration of the temperature adjusting mechanism 282 shown in FIG. 11 may be the same as that of the temperature adjusting mechanism 282 shown in FIG. 8.

The receiving surface S of the receiving member 283a of the receiving part 283 shown in FIG. 11 may be coated with a damper material 287b instead of the coating material 287a. The damper material 287b may absorb the impact. In addition, the damper material 287b may have a contact angle of greater than 90 degrees with the liquid target 27.

The damper material 287b may be graphite felt. The graphite felt may be formed by tangling carbon fibers, each having a diameter of about 5 μm, in a three-dimensional network. The graphite felt may be a material having a contact angle of 149 degrees with molten tin. The contact angle of the graphite felt with the target 27 is greater than 90 degrees. The damper material 287b may be a ceramic material or a glass material having a porous structure. The damper material 287b may be a ceramic material or a glass material having a porous structure, which is made of, for example, silicon carbide, silicon nitride, aluminium oxide, zirconium oxide, or silicon oxide. The damper material 287b may be fabric cloth made of quartz glass fibers.

As shown in FIG. 12, the receiving surface S covered with the damper material 287b can absorb the impact at the time when the target 27 having entered the target collector 28 collides against the receiving surface S. The external force acting on the target 27 colliding against the receiving surface S may be smaller than when the receiving surface S is not covered with the damper material 287b. Therefore, the target 27 colliding against the receiving surface S is not easy to be crushed as compared to when the receiving surface S is not covered with the damper material 287b. Even when the target 27 colliding against the receiving surface S is crushed, it is possible to significantly reduce the amount and the speed of the dispersion of the fragmented materials 274 generated by the collision against the receiving surface S, as compared to when the receiving surface S is not covered with the damper material 287b.

In addition, the receiving surface S covered with the damper material 287b may not be easy to be wetted by the target 27 having entered the target collector 28. Therefore, the target 27 crushed by the collision against the receiving surface S may not stay on and stick to the receiving surface S but may move to the bottom portion 281b side along the receiving surface S. Then, the target 27 moving to the bottom portion 281b side along the receiving surface S may fall from the receiving surface S and reach the collection container 281. By this means, it is possible to prevent the target 27 newly entering the target collector 28 from sticking to the previous target 27 stuck on the receiving surface S, and also prevent the target 27 from dispersing as the fragmented materials 274.

The material that absorbs the impact and has a contact angle of greater than 90 degrees with the target 27 may not be limited to be used as the damper material 287b to cover the receiving surface S of the receiving member 283a. The material that absorbs the impact and has a contact angle of greater than 90 degrees with the target 27 may be used as a material for forming the receiving member 283a itself. In addition, the material that absorbs the impact and has a contact angle of greater than 90 degrees with the target 27 may be used as a material for forming the prevention member 284 itself or the guide member 285 itself.

The other configuration of the receiving part 283 shown in FIG. 11 may be the same as the configuration of the receiving part 283 shown in FIG. 8.

The inner surfaces of the bottom portion 281b and the side portion 281c of the collection container 281 shown in FIG. 11 may not be coated with the coating material 287a. The inner surfaces of the bottom portion 281b and the side portion 281c may be covered with the damper material 287b (not shown). The other configuration of the collection container 281 may be the same as the configuration of the collection container 281 shown in FIG. 8.

The tapered surface 284b of the prevention part 284 shown in FIG. 11 may be covered with the damper material 287b. The tapered surface 284b facing the receiving surface S may be covered with the damper material 287b. The tapered surface 284b covered with the damper material 287b can absorb the impact at the time when the fragmented materials 274 generated by the collision against the receiving surface S collide against the tapered surface 284b. By this means, it is possible to reduce the amount and the speed of the dispersion of the fragmented materials 274 generated by the collision against the tapered surface 284b. In addition, it is possible to prevent the fragmented materials 274 generated by the collision against the receiving surface S from staying on and sticking to the tapered surface 284b. The other configuration of the prevention part 284 may be the same as the configuration of the prevention part 284 shown in FIG. 8.

The tapered surface 285b of the guide part 285 shown in FIG. 11 may be covered with the damper material 287b. The tapered surface 285b covered with the damper material 287b can absorb the impact at the time when the target 27 having entered the target collector 28 not through the target traveling path 272 collides against the tapered surface 285b. By this means, it is possible to reduce the amount and the speed of the dispersion of the fragmented materials 274 generated by the collision against the tapered surface 285b. In addition, it is possible to prevent the target 27 having entered the target collector 28 not through the target traveling path 272 from staying on and sticking to the tapered surface 285b. The other configuration of the guide part 285 may be the same as the configuration of the guide part 285 shown in FIG. 8.

Since the fifth example of the target collector 28 has the above-described configuration, the target 27 having entered the target collector 28 can collide directly against the receiving surface S of the receiving member 283a. In this case, the impact at the time when the target 27 collides against the receiving surface S may be absorbed into the damper material 287b on the receiving surface S. Therefore, the fifth example of the target collector 28 can significantly reduce the amount and the speed of the dispersion of the fragmented materials 274 generated by the collision against the receiving surface S, as compared to the second example of the target collector 28. In addition, by providing the receiving surface S with the damper material 287b, the receiving surface S is not easy to be wetted by the target 27. Therefore, the target 27 having entered the target collector 28 is not easy to stay on and stick to the receiving surface S, in the same way as the second example of the target collector 28. Consequently, the fifth example of the target collector 28 can more effectively prevent the fragmented materials 274 from dispersing to the outside of the target collector 28 than the second example of the target collector 28.

Moreover, with the fifth example of the target collector 28, the target 27 having entered the target collector 28 not through the target traveling path 272 can collide against the receiving surface S of the receiving member 283a by way of the tapered surface 285b of the guide part 285. In this case, the impact at the time when the target 27 collides against the tapered surface 285b can be absorbed into the damper material 287b on the tapered surface 285b. Therefore, the fifth example of the target collector 28 can significantly reduce the amount and the speed of the dispersion of the fragmented materials 274 generated by the collision against the tapered surface 285b, as compared to the second example of the target collector 28. In this case, by providing the tapered surface 285b with the damper material 287b, the tapered surface 285b is not easy to be wetted by the target 27. Therefore, the target 27 having entered the target collector 28 is not easy to stay on and stick to the tapered surface 285b, in the same way as the second example of the target collector 28. Consequently, the fifth example of the target collector 28 can more efficiently collect the target 27 having entered the target collector 28 not through the target traveling path 272 while preventing the target 27 from dispersing to the outside of the target collector 28, than the second example of the target collector 28.

6.2 Sixth Example of the Target Collector

With reference to FIG. 13, the configuration of the sixth example of the target collector 28 will be described. As shown in FIG. 13, the sixth example of the target collector 28 may include the collection container 281, the temperature adjusting mechanism 282, the receiving part 283, the second receiving part 288, the third receiving part 289, the prevention part 284, and the guide part 285. The configurations of the sixth example of the target collector 28 shown in FIG. 13, which are the same as those of the third example of the target collector 28 shown in FIG. 9, will not be described again here.

The configuration of the collection container 281 shown in FIG. 13 may be the same as that of the collection container 281 shown in FIG. 9. The configuration of the temperature adjusting mechanism 282 shown in FIG. 13 may be the same as that of the temperature adjusting mechanism 282 shown in FIG. 9. The configuration of the receiving part 283 shown in FIG. 13 may be the same as that of the receiving part 283 shown in FIG. 9. The configuration of the guide part 285 shown in FIG. 13 may be the same as that of the guide part 285 shown in FIG. 9.

The tapered surface 284b of the prevention part 284 facing the receiving surface S may be covered with the damper material 287b. The tapered surface 284b covered with the damper material 287b can absorb the impact at the time when the fragmented materials 274 generated by the collision against the receiving surface S collide against the tapered surface 284b. By this means, it is possible to reduce the amount and the speed of the dispersion of the fragmented materials 274 generated by the collision against the tapered surface 284b. In addition, it is possible to prevent the fragmented materials 274 generated by the collision against the receiving surface S from staying on and sticking to the tapered surface 284b. The other configuration of the prevention part 284 may be the same as the configuration of the prevention part 284 shown in FIG. 9.

The surface of the second receiving member 288a of the second receiving part 288 shown in FIG. 13, which receives the fragmented materials 274 generated by the collision against the tapered surface 284b, may be covered with the damper material 287b. The surface of the third receiving member 289a of the third receiving part 289 shown in FIG. 13, which receives the fragmented materials 274 generated by the collision against the second receiving member 288a, may be covered with the damper material 287b. The surfaces of the second receiving member 288a and the third receiving member 289a, which are covered with the damper material 287b, can absorb the impact at the time when the fragmented materials 274 collide against the surfaces of the second receiving member 288a and the third receiving member 289a. By this means, it is possible to reduce the amount and the speed of the dispersion of the fragmented materials 274 generated by the collision against the surfaces of the second receiving member 288a and the third receiving member 289a. In addition, it is possible to prevent the fragmented materials 274 having collided against the surfaces of the second receiving member 288a and the third receiving member 289a from staying on and sticking to these surfaces. The other configurations of the second receiving part 288 and the third receiving part 289 may be the same as those of the second receiving part 288 and the third receiving part 289 shown in FIG. 9.

Since the sixth example of the target collector 28 has the above-described configuration, it is possible to absorb the impact at the time when the fragmented materials 274 generated by the collision against the receiving surface S collide against each of the prevention part 284, the second receiving part 288, and the third receiving part 289. By this means, the sixth example of the target collector 28 can more effectively reduce the amount and the speed of the dispersion of the fragmented materials 274 generated by the collision against the prevention part 284, the second receiving part 288, and the third receiving part 289 than the third example of the target collector 28. Therefore, the sixth example of the target collector 28 can more effectively prevent the fragmented materials 274 from dispersing to the outside of the target collector 28 than the third example of the target collector 28.

7. Target Collector of the EUV Generation Apparatus According to Embodiment 3

Figure 14:
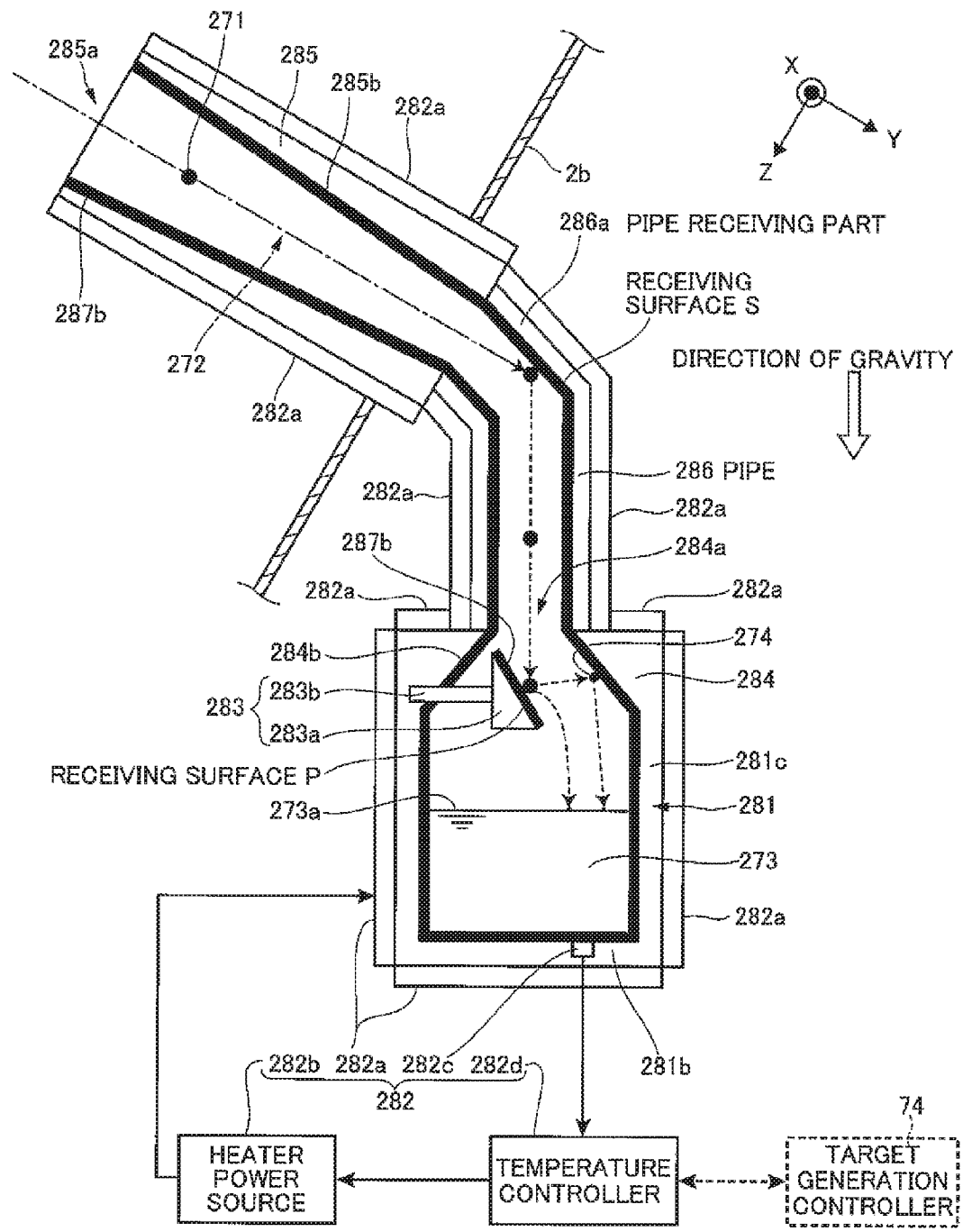
FIG. 14 shows the configuration of a seventh example of the target collector.

With reference to FIG. 14, the target collector 28 of the EUV light generation apparatus 1 according to Embodiment 3 will be described.

With the EUV light generation apparatus 1 according to Embodiment 3, a Z direction in which the EUV light 252 is outputted from the chamber 2 of the EUV light generation apparatus 1 to the exposure device 6 may be inclined with respect to the horizontal direction. Therefore, the chamber 2 may be provided such that the direction of its central axis is inclined with respect to the horizontal direction. The target supply part 26 provided on the side surface of the chamber 2 may be provided such that the direction of the central axis of the nozzle 262 is inclined with respect to the direction of gravity. The target traveling path 272 may be inclined with respect to the direction of gravity.

Hereinafter, the target collector 28 of the EUV light generation apparatus 1 according to Embodiment 3 will be explained as the seventh example of the target collector 28. The configurations of the target collector 28, which are the same as those of the target collector 28 shown in FIGS. 2 and 3, those of the first to fourth examples of the target collector 28 shown in FIGS. 5 to 10, and those of the fifth and sixth examples of the target collector 28 shown in FIGS. 11 to 13, will not be described again here.

7.1 Seventh Example of the Target Collector

With reference to FIG. 14, the configuration of the seventh example of the target collector 28 will be described. As shown in FIG. 14, the seventh example of the target collector 28 may include the collection container 281, the temperature adjusting mechanism 282, the receiving part 283, the prevention part 284, the guide part 285, and a pipe 286.

The configuration of the temperature adjusting mechanism 282 shown in FIG. 14 may be the same as that of the temperature adjusting mechanism 282 shown in FIG. 11.

The collection container 281 shown in FIG. 14 may be disposed such that the direction of its central axis is parallel to the direction of gravity. The inner surfaces of the bottom portion 281b and the side portion 281c of the collection container 281 may be covered with the damper material 287b. The other configuration of the collection container 281 may be the same as the configuration of the collection container 281 shown in FIG. 11.

The guide part 285 shown in FIG. 14 may be disposed such that the direction of its central axis matches the target traveling path 272. The direction of the central axis of the guide part 285 may be inclined with respect to the direction of gravity. The guide part 285 may be formed to extend from one end of the pipe 286 as the base end, toward the target supply part 26 and the plasma generation region 25. The guide part 285 may introduce the target 27 having entered the target collector 28 into the opening 284a of the prevention part 284 via the pipe 286. The guide part 285 may guide the fragmented materials 274 generated by the collision of the target 27 against the tapered surface 285b to the opening 284a via the pipe 286. The other configuration of the guide part 285 may be the same as the configuration of the guide part 285 shown in FIG. 11.

The pipe 286 may connect between the collection container 281 and the guide part 285. The pipe 286 may be disposed outside the chamber 2. The inner periphery of the pipe 286 may be covered with the damper material 287b. The pipe 286 may be formed to extend from one end of the guide part 285 opposite to the opening 285a as the base end, toward the prevention part 284 formed integrally with the collection container 281. The pipe 286 extending from the one end of the guide part 285 as the base end may be bent on the extension of the target traveling path 272 and extend toward the prevention part 284. The pipe 286 may allow the communication between the collection container 281, the prevention part 284, and the guide part 285. The bent portion of the pipe 286 may be located at the intersection of the target traveling path 272 and the extension of the central axis of the collection container 281 and the prevention part 284. The bent portion of the pipe 286 may include a pipe receiving part 286a.

The pipe receiving part 286a may receive the target 27 having entered the target collector 28 or the fragmented materials 274 of the target 27. The pipe receiving part 286a may receive the target 27 having entered the target collector 28 or the fragmented materials 274 of the target 27 by making the target 27 or the fragmented materials 274 collide against the receiving surface S. The receiving surface S of the pipe receiving part 286a may be covered with the damper material 287b. The receiving surface S covered with the damper material 287b can absorb the impact at the time when the target 27 having entered the target collector 28 or the fragmented materials 274 of the target 27 collide(s) against the receiving surface S.

The receiving surface S of the pipe receiving part 286a may be disposed to face the target supply part 26 and the plasma generation region 25. The receiving surface S may be disposed to face a receiving surface P (described later) of the receiving part 283. The receiving surface S of the pipe receiving part 286a may be located on the target traveling path 272. The receiving surface S may be inclined with respect to the target traveling path 272 with a predetermined inclination angle. The inclination angle of the receiving surface S may be provided to prevent the fragmented materials 274 generated by the collision against the receiving surface S from dispersing to the outside of the target collector 28. The inclination angle of the receiving surface S with respect to the target traveling path 272 may be provided such that the incidence angle $\theta$ of the target 27 satisfies $0°<\theta<90°$. More preferably, the inclination angle of the receiving surface S with respect to the target traveling path 272 may be provided such that the incidence angle $\theta$ of the target 27 satisfies $45°<\theta<90°$. The receiving surface S of the pipe receiving part 286a may reflect the target 27 incident on the receiving surface S or the fragmented materials 274 of the target 27, toward the receiving surface P of the receiving part 283.

The receiving part 283 shown in FIG. 14 may receive the target 27 or the fragmented materials 274 of the target 27 reflected by the receiving surface S of the pipe receiving part 286a. The target 27 or the fragmented materials 274 of the target 27 reflected by the receiving surface S of the pipe receiving part 286a may collide against the receiving surface P of the receiving member 283a of the receiving part 283, and therefore be received by the receiving member 283a. The other configuration of the receiving surface P of the receiving member 283a may be the same as the configuration of the receiving surface S of the receiving part 283 shown in FIG. 11. The other configuration of the receiving part 283 may be the same as the configuration of the receiving part 283 shown in FIG. 11.

The prevention part 284 shown in FIG. 14 may prevent the fragmented materials 274 generated by the collision against the receiving surface P from dispersing to the outside of the target collector 28. The prevention part 284 may be formed to extend from the periphery of the opening 281a of the collection container 281 as the base end, toward the direction opposite to the direction of gravity matching the direction of the central axis of the collection container 281. The upper end of the prevention part 284 may be connected to the bottom end of the pipe 286. Not only the portion facing the receiving surface P of the receiving part 283, but also the other portion of the tapered surface 284b of the prevention part 284 may be covered with the damper material 287b. The other configuration of the prevention part 284 may be the same as the configuration of the prevention part 284 shown in FIG. 11.

With the above-described configuration, the seventh example of the target collector 28 can collect the target 27 while preventing the target 27 from dispersing to the outside of the target collector 28, even though the target traveling path 272 is inclined with respect to the direction of gravity, or the target 27 enters the target collector 28 not through the target traveling path 272.

8. Others 8.1 Hardware Environment of Each Controller

A person skilled in the art would understand that the subject matters disclosed herein can be implemented by combining a general purpose computer or a programmable controller with a program module or a software application. In general, the program module includes routines, programs, components and data structures which can execute the processes disclosed herein.

Figure 15:
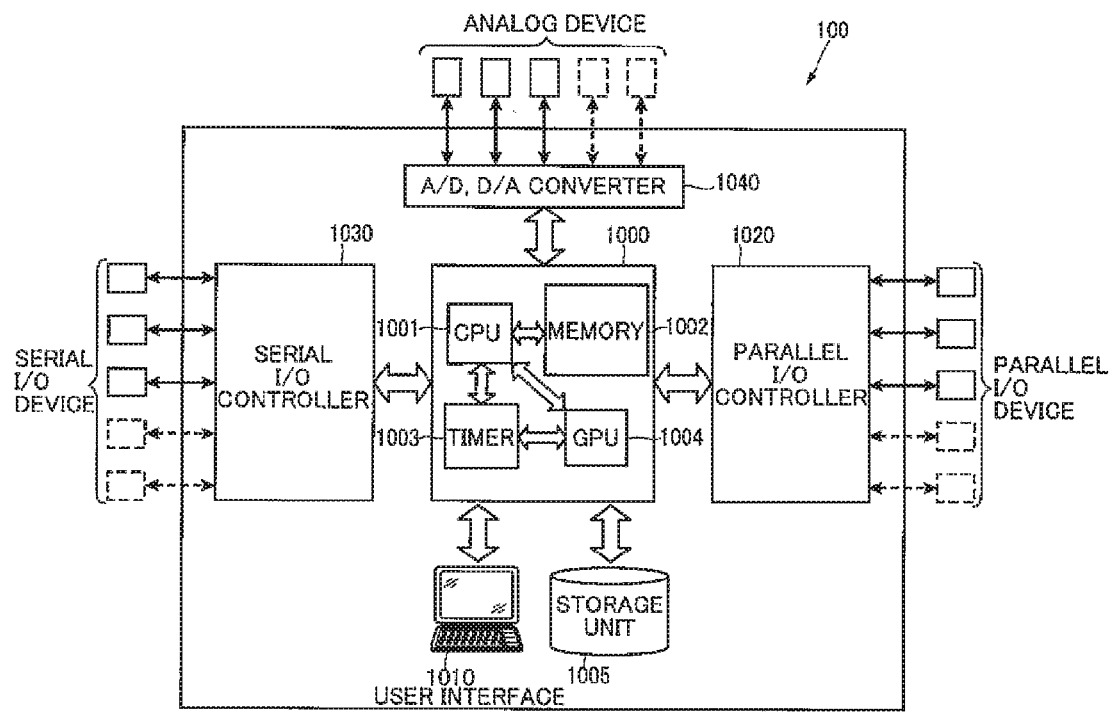
FIG. 15 is a block diagram showing the hardware environment of each of the controllers.

FIG. 15 is a block diagram showing an exemplary hardware environment in which various aspects of the subject matters disclosed herein can be implemented. An exemplary hardware environment 100 shown in FIG. 15 may include a processing unit 1000, a storage unit 1005, a user interface 1010, a parallel I/O controller 1020, a serial I/O controller 1030, and an A/D, D/A converter 1040, but the configuration of the hardware environment 100 is not limited to this.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any of commercially available processors. A dual microprocessor or another multiprocessor architecture may be used as the CPU 1001.

The components shown in FIG. 15 may be interconnected with each other to perform the processes described herein.

During its operation, the processing unit 1000 may read and execute the program stored in the storage unit 1005, read data together with the program from the storage unit 1005, and write the data to the storage unit 1005. The CPU 1001 may execute the program read from the storage unit 1005. The memory 1002 may be a work area in which the program executed by the CPU 1001 and the data used in the operation of the CPU 1001 are temporarily stored. The timer 1003 may measure a time interval and output the result of the measurement to the CPU 1001 according to the execution of the program. The GPU 1004 may process image data according to the program read from the storage unit 1005, and output the result of the process to the CPU 1001.

The parallel I/O controller 1020 may be connected to parallel I/O devices that can communicate with the processing unit 1000, such as the EUV light generation controller 5, the target generation controller 74, and the temperature controller 282d. The parallel I/O controller 1020 may control the communication between the processing unit 1000 and those parallel I/O devices. The serial I/O controller 1030 may be connected to serial I/O devices that can communicate with the processing unit 1000, such as the heater power source 712, the heater power source 282b, the piezoelectric power source 732, and the pressure regulator 721. The serial I/O controller 1030 may control the communication between the processing unit 1000 and those serial I/O devices. The A/D, D/A converter 1040 may be connected to analog devices such as the temperature sensor, the pressure sensor, various sensors for a vacuum gauge, the target sensor 4, and the temperature sensor 282c via analog ports, may control the communication between the processing unit 1000 and those analog devices, and may perform A/D, D/A conversion of the contents of the communication.

The user interface 1010 may present the progress of the program executed by the processing unit 1000 to an operator, in order to allow the operator to command the processing unit 1000 to stop the program and to execute an interruption routine.

The exemplary hardware environment 100 may be applicable to the EUV light generation controller 5, the target generation controller 74, and the temperature controller 282d in the present disclosure. A person skilled in the art would understand that those controllers may be realized in a distributed computing environment, that is, an environment in which tasks are performed by the processing units connected to each other via a communication network. In this disclosure, the EUV light generation controller 5, the target generation controller 74, and the temperature controller 282d may be connected to each other via a communication network such as Ethernet or Internet. In the distributed computing environment, the program module may be stored in both of a local memory storage device and a remote memory storage device.

8.2 Modification

The coating material 287a may have a contact angle of greater than 90 degrees with the target 27 and not be easy to react with the target 27. When the target 27 is tin, the coating material 287a may not be easy to be wetted by molten tin and not be easy to react with molten tin. The material that is not easy to be wetted by molten tin and not easy to react with molten tin may be, for example, silicon carbide, silicon oxide, aluminium oxide, zirconium oxide, carbon, and molybdenum oxide which has not been vacuum heat treated. In the same way, the damper material 287b may absorb the impact, have a contact angle of greater than 90 degrees with the target 27, and not be easy to react with the target 27.

The seventh example of the target collector 28 may not have the receiving part 283 because of having the receiving surface S of the pipe receiving part 286a covered with the damper material 287b. All the inner peripheries of the collection container 281, the prevention part 284, the guide part 285 and the pipe 286 of the seventh example of the target collector 28 may not necessarily be covered with the damper material 287b. Only the region of the seventh example of the target collector 28 against which the target 27 or the fragmented materials 274 of the target 27 collide(s) may be covered with the damper material 287b. Alternatively, the coating material 287a for coating may be used instead of the damper material 287b.

It would be obvious to a person skilled in the art that the technologies described in the above-described embodiments including the modifications may be compatible with each other.

For example, the receiving part 283 of the fifth example of the target collector 28 may be applied to the sixth example of the target collector 28, and the receiving surface S of the receiving part 283 of the sixth example of the target collector 28 may be covered with the damper material 287b. Moreover, the second receiving part 288 and the third receiving part 289 of the third or sixth example of the target collector 28 may be applied to the seventh example of the target collector 28, so that the seventh example of the target collector 28 includes the second receiving part 288 and the third receiving part 289.

The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" or "be included" should be interpreted as "including the stated elements but not limited to the stated elements." The term "have" should be interpreted as "having the stated elements but not limited to the stated elements." Further, the indefinite article "one (a/an)" described in the specification and the appended claims should be interpreted as "at least one" or "one or more."

REFERENCE SIGNS LIST

1 EUV light generation apparatus
2 chamber
26 target supply part
27 target
28 target collector
281 collection container
284 prevention part
284a opening
285 guide part
287a coating material
287b damper material
5 EUV light generation controller
7 target generation device
74 target generation controller
S receiving surface

The invention claimed is:

1. An extreme ultraviolet light generation apparatus comprising:
 a chamber in which extreme ultraviolet light is generated when a target is irradiated with a laser beam inside the chamber;
 a target supply part configured to supply the target into the chamber; and
 a target collector configured to collect the target which is supplied by the target supply part but is not irradiated with the laser beam in a collection container, by receiving the target on a first receiving surface having a contact angle of greater than 90 degrees with the target, the target collector including:
 a prevention part including an opening to introduce the target into the collection container and configured to prevent the target reflected by the first receiving surface from dispersing to an outside of the target collector;
 a guide part configured to introduce the target into the opening of the prevention part, a diameter of an opening formed in an upper end of the guide part being greater than a diameter of the opening of the prevention part;
 a peripherally extending collection container wall; and
 at least one second receiving surface positioned a first spaced distance from the first receiving surface and a second spaced distance from the collection container wall.

2. The extreme ultraviolet light generation apparatus according to claim 1, wherein an incidence angle $\theta$ of the target incident on the receiving surface satisfies $0° < \theta < 90°$.

3. The extreme ultraviolet light generation apparatus according to claim 1, wherein the receiving surface is made of a damper material that absorbs an impact of the target entering the receiving surface.

4. The extreme ultraviolet light generation apparatus according to claim 3, wherein the damper material contains graphite felt, carbon fibers or fabric cloth made of quartz glass fibers.

5. The extreme ultraviolet light generation apparatus according to claim 1, wherein an inner periphery of the prevention part has a contact angle of greater than 90 degrees with the target.

6. The extreme ultraviolet light generation apparatus according to claim 1, wherein an inside diameter of the guide part is increased toward the target supply part.

7. The extreme ultraviolet light generation apparatus according to claim 1, wherein the guide part includes a tapered surface.

8. The extreme ultraviolet light generation apparatus according to claim 7, wherein the tapered surface has a contact angle of greater than 90 degrees with the target.

9. The extreme ultraviolet light generation apparatus according to claim 7, wherein:
 the target collector further comprises a first receiving part including a first receiving surface configured to receive the target, and
 an inclination angle of the tapered surface with respect to a traveling path of the target is equal to or smaller than an inclination angle of the first receiving surface with respect to the traveling path of the target.

10. The extreme ultraviolet light generation apparatus according to claim 1, wherein the target collector further comprises a second receiving part and the second receiving surface is positioned on the second receiving part to receive the target reflected by the prevention part.

11. The extreme ultraviolet light generation apparatus according to claim 10, wherein the second receiving surface has a contact angle of greater than 90 degrees with the target.

12. The extreme ultraviolet light generation apparatus according to claim 10, wherein the target collector further comprises a third receiving part including a third receiving surface to receive the target reflected by the second receiving part.

13. The extreme ultraviolet light generation apparatus according to claim 12, wherein the third receiving surface is covered with a damper material.

14. The extreme ultraviolet light generation apparatus according to claim 13, wherein the damper material contains graphite felt, carbon fibers or fabric cloth made of quartz glass fibers.

15. The extreme ultraviolet light generation apparatus according to claim 10, wherein the second receiving surface is covered with a damper material.

16. The extreme ultraviolet light generation apparatus according to claim 15, wherein the damper material contains graphite felt, carbon fibers or fabric cloth made of quartz glass fibers.

17. The extreme ultraviolet light generation apparatus according to claim 1, wherein:
 the target collector further comprises a first receiving part including a first receiving surface configured to receive the target, and
 the prevention part includes a tapered surface facing the first receiving surface that is covered with a damper material.

18. The extreme ultraviolet light generation apparatus according to claim 17, wherein the damper material contains graphite felt, carbon fibers or fabric cloth made of quartz glass fibers.

* * * * *